(12) United States Patent
Schauer

(10) Patent No.: US 6,778,874 B2
(45) Date of Patent: Aug. 17, 2004

(54) CASSETTE AND WORKPIECE HANDLER CHARACTERIZATION TOOL

(76) Inventor: Ronald Vern Schauer, 9480 Sugar Babe Dr., Gilroy, CA (US) 95020

( * ) Notice: Subject to any disclaimer, the term of this patent is extended or adjusted under 35 U.S.C. 154(b) by 0 days.

(21) Appl. No.: 10/322,203

(22) Filed: Dec. 17, 2002

(65) Prior Publication Data

US 2003/0130761 A1 Jul. 10, 2003

Related U.S. Application Data

(60) Provisional application No. 60/346,232, filed on Dec. 31, 2001.

(51) Int. Cl.[7] ............................ G06F 19/00; G06F 7/00; B65G 49/07
(52) U.S. Cl. ..................... 700/112; 700/218; 700/228; 414/937
(58) Field of Search .............................. 700/112, 114, 700/121, 228, 218, 57, 59, 60; 414/937–941

(56) References Cited

U.S. PATENT DOCUMENTS

| | | | |
|---|---|---|---|
| 5,605,428 A | | 2/1997 | Birkner et al. |
| 6,546,307 B1 | * | 4/2003 | Hsiao ........................ 700/121 |
| 2002/0021959 A1 | * | 2/2002 | Schauer et al. .......... 414/744.2 |
| 2003/0060922 A1 | * | 3/2003 | Schauer et al. ............. 700/213 |

FOREIGN PATENT DOCUMENTS

| | | |
|---|---|---|
| EP | 1047115 | 10/2000 |
| JP | 6131032 | 5/1994 |
| JP | 2001210699 | 8/2001 |

OTHER PUBLICATIONS

PCT/US02/39840 International Search Report mailed Apr. 25, 2003 (7 pp).

* cited by examiner

*Primary Examiner*—Albert W. Paladini
*Assistant Examiner*—Ryan Jarrett
(74) *Attorney, Agent, or Firm*—Konrad Raynes Victor & Mann, LLP; Loretta A. Peters

(57) ABSTRACT

An alignment tool, method and system for aligning a cassette handler to a robot blade in a workpiece handling system so as to compensate for tilt exhibited by an elevator shaft as the cassette is elevated between various slot positions. In one embodiment, the cassette tilt angle may be measured at a first height of the cassette. After activating the elevator to raise the cassette to a second slot position, preferably near the other end of the cassette, the tilt angle of the cassette may be measured again. If the tilt angle has changed, such change has likely been induced by the elevator. The cassette tilt angle may be adjusted in accordance with the measured angle at which the elevator shaft tilts the cassette as the cassette is raised or lowered to reduce accidental breakage or damaging of wafers or other workpieces.

19 Claims, 21 Drawing Sheets

```
BLUE    1.111 in    L/R 0.000 in
YELLOW  1.111 in    F/B 0.000 in
RED     1.444 in
```
— 530

FIG.19

CASSETTE AND WORKPIECE HANDLER CHARACTERIZATION TOOL

RELATED APPLICATIONS

The present invention is related to, and claims the benefit under 35 U.S.C. 119(e) of, U.S. Provisional Application No. 60/346,232 filed Dec. 31, 2001, which is incorporated herein by reference in its entirety.

FIELD OF THE INVENTION

The present invention relates to automated workpiece handling systems, and more particularly, to methods and devices for aligning a cassette for workpieces in an automated workpiece handling system.

BACKGROUND OF THE INVENTION

In order to decrease contamination and to enhance throughput, semiconductor processing systems often utilize one or more robots to transfer semiconductor wafers, substrates and other workpieces between a number of different vacuum chambers which perform a variety of tasks. An article entitled "Dry Etching Systems: Gearing Up for Larger Wafers", in the October, 1985 issue of Semiconductor International magazine, pages 48–60, describes a four-chamber dry etching system in which a robot housed in a pentagonal-shaped mainframe serves four plasma etching chambers and a loadlock chamber mounted on the robot housing. In order to increase throughput, it has been proposed to utilize two loadlock chambers as described in U.S. Pat. No. 5,186,718. In such a two-loadlock system, both loadlock chambers are loaded with full cassettes of unprocessed wafers. FIG. 1 of the present application illustrates two typical loadlock chambers LLA and LLB, each having a cassette 190 therein for holding unprocessed wafers 192 to be unloaded by a robot 194 and transferred to various processing chambers 196 attached to a mainframe 198.

The loadlock chamber LLA, for example, is a pressure-tight enclosure which is coupled to the periphery of the mainframe 198 by interlocking seals which permit the loadlock chamber to be removed and reattached to the mainframe as needed. The cassette 190 is loaded into the loadlock chamber LLA through a rear door which is closed in a pressure-tight seal. The wafers are transferred between the mainframe 198 and the loadlock chamber LLA through a passageway 199 which may be closed by a slit valve to isolate the loadlock chamber volume from the mainframe volume.

As shown in FIG. 2, a typical cassette 190 is supported by a platform 200 of a cassette handler system 208 which includes an elevator 210 which elevates the platform 200 and the cassette 190. The platform 200 has a top surface which defines a base plane 220 on which the cassette 190 rests. As the cassette includes a plurality of "slots" 204 or wafer support locations, the elevator moves the cassette to sequentially position each of the slots with the slit valves to allow a robot blade to pass from the mainframe, through the slit valve, and to a location to "pick" or deposit a wafer in a wafer slot.

The slots 204 of the cassette may be initially loaded with as many as 25 or more unprocessed wafers or other workpieces before the cassette is loaded into the loadlock chamber LLA. After the loadlock access door is closed and sealed, the loadlock chamber is then pumped by a pump system down to the vacuum level of the mainframe 198 before the slit valve is opened. The robot 194 which is mounted in the mainframe 198 then unloads the wafers from the cassette one at a time, transferring each wafer in turn to the first processing chamber. The robot 194 includes a robot hand or blade 206 which is moved underneath the wafer to be unloaded. The robot 194 then "lifts" the wafer from the wafer slot supports supporting the wafers in the cassette 190. By "lifting," it is meant that either the robot blade 206 is elevated or the cassette 190 is lowered by the handler mechanism 208 such that the wafer is lifted off the cassette wafer supports. The wafer may then be withdrawn from the cassette 190 through the passageway and transferred to the first processing chamber.

Once a wafer has completed its processing in the first processing chamber, that wafer is transferred to the next processing chamber (or back to a cassette) and the robot 194 unloads another wafer from the cassette 190 and transfers it to the first processing chamber. When a wafer has completed all the processing steps of the wafer processing system, and two cassettes full of wafers are loaded in the loadlocks, the robot 194 returns the processed wafer back to the cassette 190 from which it came. Once all the wafers have been processed and returned to the cassette 190, the cassette in the loadlock chamber is removed and another full cassette of unprocessed wafers is reloaded. Alternatively, a loaded cassette may be placed in one loadlock, and an empty one in the other loadlock. Wafers are thus moved from the full cassette, processed, and then loaded into the (initially) empty cassette in the other loadlock. Once the initially empty cassette is full, the initially full cassette will be empty. The full "processed" cassette is exchanged for a full cassette of unprocessed wafers, and these are then picked from the cassette, processed, and returned to the other cassette. The movements of the robot 194 and the cassette handler 208 are controlled by an operator system controller 222 (FIG. 1) which is often implemented with a programmed workstation.

As shown in FIGS. 2 and 3, the wafers are typically very closely spaced in many wafer cassettes. For example, the spacing between the upper surface of a wafer carried on a moving blade and the lower surface of an adjacent wafer in the cassette may be as small as 0.050 inches. Thus, the wafer blade must be very thin, to fit between wafers as cassettes are loaded or unloaded. As a consequence, it is often important in many processing systems for the cassette and the cassette handler 208 to be precisely aligned with respect to the robot blade and wafer to avoid accidental contact between either the robot blade or the wafer carried by the blade and the walls of the cassette or with other wafers held within the cassette.

However, typical prior methods for aligning the handler and cassette to the robot blade have generally been relatively imprecise, often relying upon subjective visual inspections of the clearances between the various surfaces. Some tools have been developed to assist the operator in making the necessary alignments. These tools have included special wafers, bars or reference "pucks" which are placed upon the robot blade and are then carefully moved into special slotted or pocketed receptacles which are positioned to represent the tolerance limits for the blade motions. However, many of these tools have a number of drawbacks. For example, some tools rely upon contact between the blade or a tool on the blade and the receptacle to indicate a condition of nonalignment. Such contact can be very detrimental to high precision mechanisms for moving the blade as well as the blade itself. Also, many such tools do not indicate the degree of alignment or nonalignment but merely a "go/no-go" indication of whether contact is likely.

In aligning the handler mechanism to the robot blade, one procedure attempts to orient the cassette to be as level as possible with respect to the robot blade. One tool that has been developed to assist in the leveling procedure has dual bubble levels in which one bubble level is placed on the blade and the other is placed on the cassette. The operator then attempts to match the level orientation of the blade to that of the cassette. In addition to being very subjective, such bubble tools have also often been difficult to see in the close confines of the cassette and handler mechanisms.

As a consequence of these and other deficiencies of the prior alignment procedures and tools, alignments have often tended to be not only imprecise but also inconsistent from application to application. These problems have frequently lead to the breakage or scratching of very expensive wafers and equipment as well as the generation of damaging particulates in the systems.

A cassette alignment tool which addresses these problems is described in copending application Ser. No.: 09/294,301, filed Apr. 19, 1999, entitled "METHOD AND APPARATUS FOR ALIGNING A CASSETTE," assigned to the assignee of the present application and incorporated by reference in its entirety. However, further improvement is useful in a number of applications as set forth below.

SUMMARY OF THE INVENTIONS

The present inventions are, in one aspect, directed to an alignment tool, method and system for aligning a cassette handler to a robot blade in a workpiece handling system so as to compensate for tilt exhibited by an elevator shaft as the cassette is elevated between various slot positions. For example, the cassette tilt angle may be measured at a first height of the cassette. After activating the elevator to raise the cassette to a second slot position, preferably near the other end of the cassette, the tilt angle of the cassette may be measured again. If the tilt angle has changed, such change has likely been induced by the elevator. Here, the cassette tilt angle may also be adjusted in accordance with the measured angle at which the elevator shaft tilts the cassette as the cassette is raised or lowered to reduce accidental breakage or damaging of wafers or other workpieces.

There are additional aspects to the present inventions as discussed below. It should therefore be understood that the preceding is merely a brief summary of some embodiments and aspects of the present inventions. Additional embodiments and aspects of the present inventions are referenced below. It should further be understood that numerous changes to the disclosed embodiments can be made without departing from the spirit or scope of the inventions. The preceding summary therefore is not meant to limit the scope of the inventions. Rather, the scope of the inventions is to be determined only by the appended claims and their equivalents.

BRIEF DESCRIPTION OF THE DRAWINGS

Embodiments of the invention are described with reference to the accompanying drawings which, for illustrative purposes, are schematic and not drawn to scale.

FIG. 19 is a view of the computer display of FIG. 4, depicting an input-output screen used to input wafer cassette specifications.

DETAILED DESCRIPTION

Figure 4:
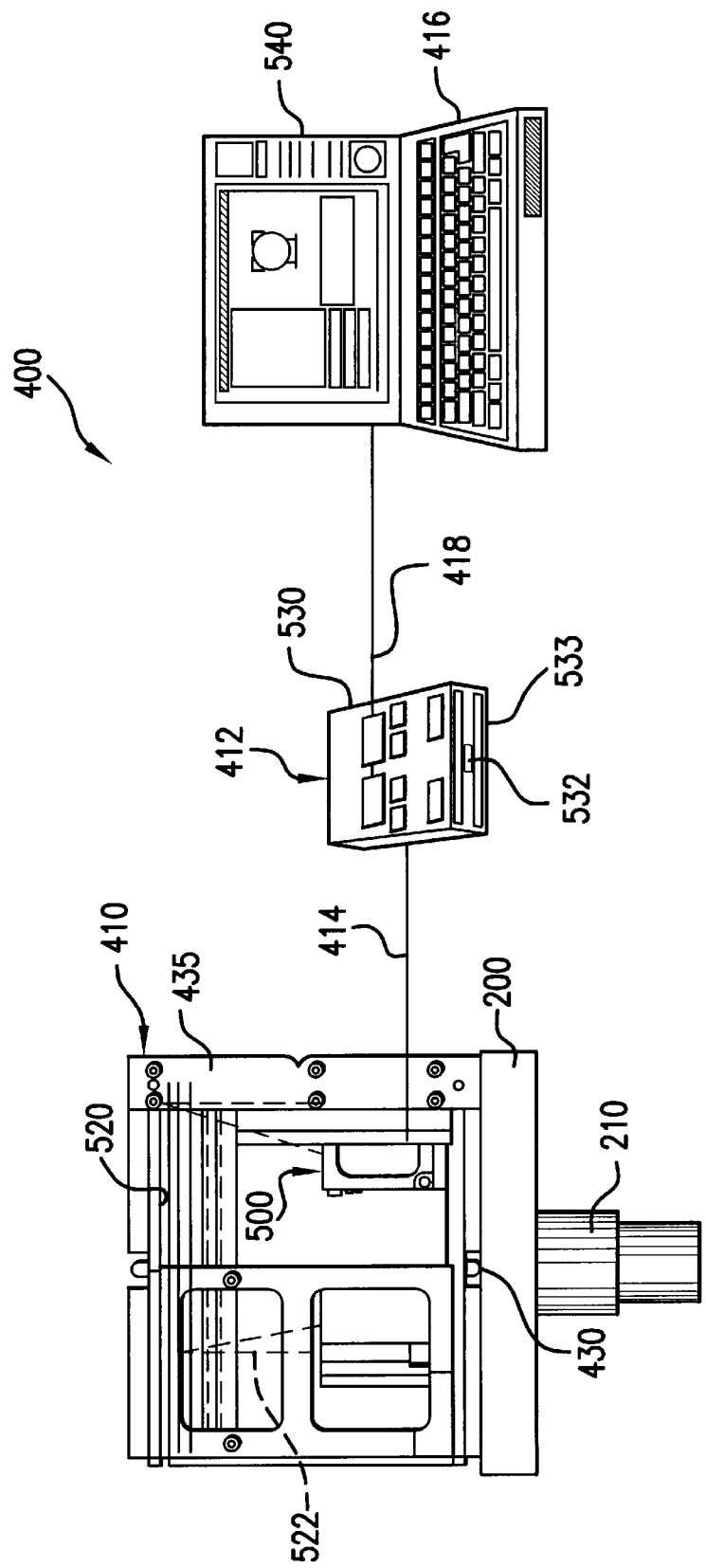
FIG. 4 is a schematic pictorial view of a cassette alignment tool system in accordance with a preferred embodiment of the present invention.

A cassette alignment tool system in accordance with a preferred embodiment of the present invention is indicated generally at 400 in FIG. 4. The cassette alignment tool 400 comprises a metrology cassette 410, cassette controller 412 coupled by a communication cable 414 to the metrology cassette 410, and a computer 416 coupled by a communication cable 418 to the cassette controller 412. The metrology cassette 410 is secured to the cassette handler platform 200 in the same manner as an actual wafer cassette such as the cassette 190 of FIG. 2 and thus emulates the wafer cassette 190. For example, the metrology cassette has alignment and registration surfaces including an H-bar 430 and side rails 570 which are received by the cassette handler to align the cassette with respect to the handler. In addition, the metrology cassette 410 approximates the size and weight of a production wafer cassette full of wafers.

The cassette alignment tool system 400 may be used with processing systems having one or many processing chambers and one or more workpiece handling systems for transferring workpieces from one or more cassettes in one or more loadlock chambers to one or more of the processing chambers. Once a particular handling system has been properly aligned and calibrated to the robot blade and workpiece, the metrology cassette 410 may be removed from the handler and processing of workpieces may begin using a standard workpiece cassette which was emulated by the metrology cassette 410. However, it is preferred that all handlers of a particular processing system be properly aligned prior to initiating processing of production workpieces.

In the illustrated embodiments, the metrology cassette 410 has a distance measurement device 500 which can provide precise measurements of the position of a wafer or other workpiece being held by the robot blade within the metrology cassette 410. As explained in greater detail below, these wafer position measurements can be used to accurately align an actual wafer cassette such as the cassette 190 to the robot blade in such a manner as to reduce or eliminate accidental contact between the blade or the wafer held by the blade and the cassette or wafers held within the wafer cassette. In one aspect of the illustrated embodiments, the cassettes may be aligned so as to compensate for tilt exhibited by an elevator shaft as the cassette is elevated between various slot positions. For example, the cassette tilt angle of the metrology cassette 410 may be measured relative to the robot blade at a first slot position of the cassette 410. After activating the elevator 210 to raise the cassette 410 to a second slot position, preferably near the other end of the cassette, the tilt angle of the metrology cassette 410 may be measured again. If the tilt angle has changed, such change has likely been induced by the elevator 210. Here, the tilt angle of the cassette relative to the robot blade may also be adjusted in accordance with the measured angle at which the elevator shaft tilts the cassette as the cassette is raised or lowered to reduce accidental breakage or damaging of cassettes.

Figure 5:
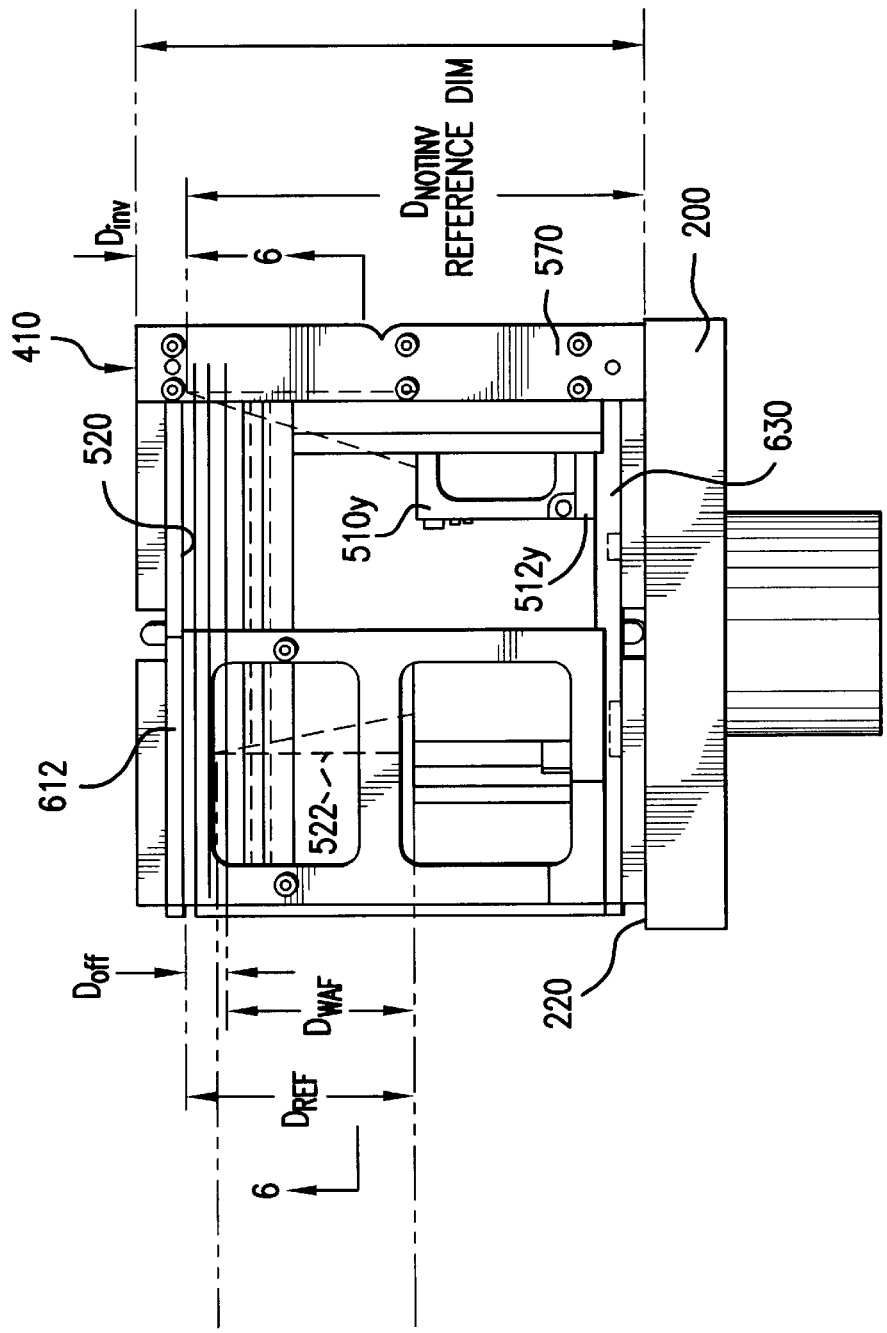
FIG. 5 is a side view of the metrology cassette of FIG. 4.
Figure 6A:
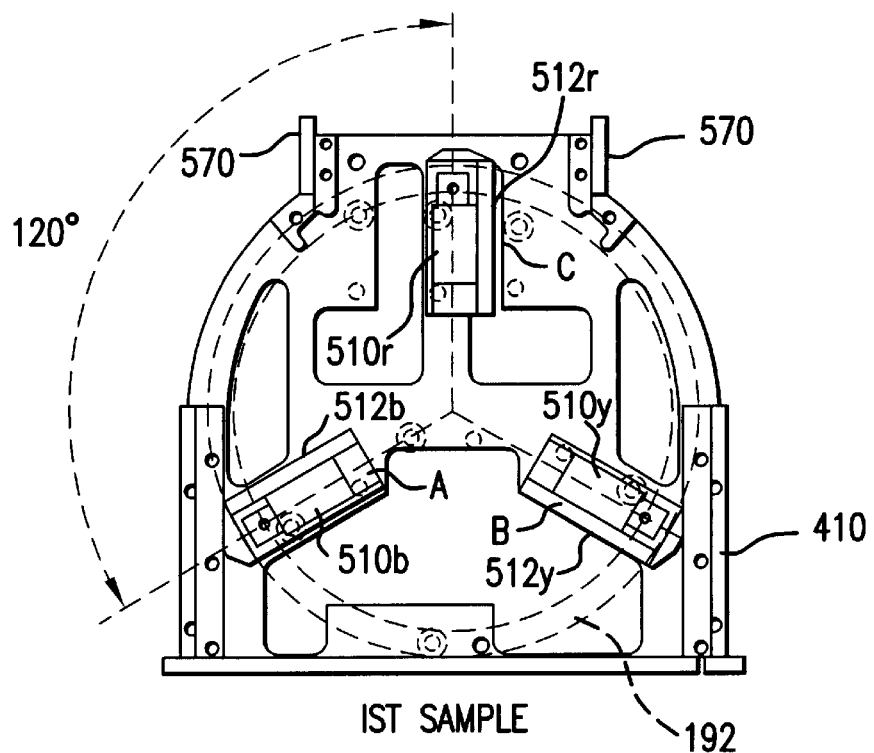
FIGS. 6A, 6B and 6C are a schematic partial cross-sectional top views of the metrology cassette of FIG. 5, showing distance sensors in various configurations.

As best seen in FIGS. 5 and 6a, in the illustrated embodiment, the distance measurement device 500 of the illustrated embodiment includes three laser sensors A, B and C, each of which includes a laser head 510b, 510r or 510y, which is clamped in a mounting 512b, 512r or 512y, respectively, carried by the metrology cassette 410. The mountings 512b, 512r and 512y are preferably color coded and mechanically keyed to reduce or eliminate inadvertent exchanges or misplacements of the laser heads in the mountings. Thus, the mountings 512b, 512r and 512y may be color coded blue, red and yellow, respectively, for example.

In the illustrated embodiment, the distance sensors are laser sensors manufactured by NaiS/Matsushita/Panasonic (Japan), model ANR12821 (high power) or ANR11821 (low power). This particular laser sensor operates based upon perpendicular beam, scattered reflection triangulation using a position sensing diode array. The light source (laser) impinges upon the target perpendicular to the surface of the target, preferably within a relatively small angle. The surface preferably provides a diffuse reflection that is visible to the sensing device over a relatively wide angle. The field of view of the sensing device is focused upon a linear optical sensor, the output of which is interpreted to determine the displacement of the target surface within the field of view. The geometry of the light path therefore forms a right triangle with light from the light source traveling along the vertical edge and reflected light of the return path traveling along the diagonal. The distance between the sensor and the target may then be calculated using the Pythagorean theorem.

Although the distance sensors are described in the illustrated embodiments as three laser sensors, it is appreciated that other types and numbers of distance measuring sensors may be used. For example, there are several different techniques and methods utilized by commercial laser distance sensors. These include scattered light triangulation, reflective triangulation, perpendicular and angled beam triangulation, time delta, interference pattern deciphering, CCD array sensors, position sensing diode sensors, position sensing photoresistor sensors, etc. It is anticipated that a variety of optical and non-optical based distance measuring sensors may be suitable as well.

Figure 6B:
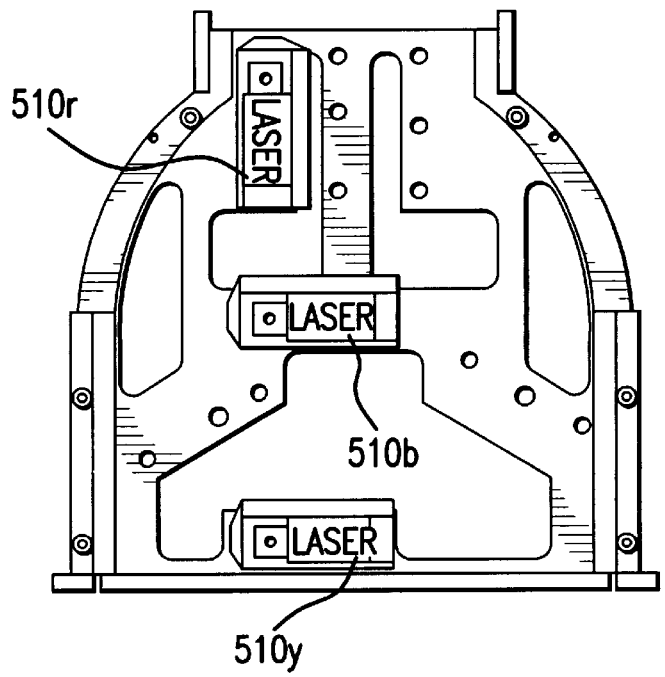

In the embodiment of FIG. 6A, the heads 510b, 510r and 510y of the laser sensors are positioned in an equilateral triangular placement which facilitates a three point plane distance determination for measuring the height and plane angle of a surface such as a wafer surface. As explained in greater detail below, the laser heads may be readily repositioned to other placements including an in-line placement for blade motion mapping (FIG. 6B), and a modified right triangle placement (FIG. 6C) for on-blade measurements.

Sensor Calibration

In the illustrated embodiments, the metrology cassette 410 includes a precision internal reference surface 520 (FIG. 5) which provides a fixed reference plane from which all measurements may be gauged. It is fixed at the top of the cassette whereas the laser sensors are fixed to the bottom. The laser sensor light beams 522 are intercepted by the reference surface 520 when no wafer is present inside the metrology cassette 410 and are reflected by the surface 520 back to the laser heads of the laser sensor.

In the illustrated embodiment, the metrology cassette 410 is manufactured so that the reference surface 520 is relatively flat and parallel with respect to the base plane 220 of the platform 200 of the cassette handler to a relatively high degree of precision. All subsequent distance measurements of the wafer can be made as offsets to this reference surface 520. Because of the effects of temperature and aging of electronics, the output of the laser sensors can often vary over time. Thus, the actual value of the laser measurements of the distance $D_{REF}$ between the laser sensors and the reference surface 520 can also vary over time even though the actual distance remains fixed. However, because all subsequent distance measurements of the wafer are made as offsets to this reference surface 520, whatever value the lasers determine the distance $D_{REF}$ between the laser sensors and the reference surface 520 to be, that value is considered to be the "zero" distance. Any subsequent measurement of wafer position is calculated as the difference or offset $D_{OFF}$ between the measured reference distance $D_{REF}$ and the measured wafer distance $D_{WAF}$. Hence, calibrating the laser sensors is simply a matter of turning the laser sensors on and after a sufficient warm up time, noting the measured reference distance $D_{REF}$ and assigning that value as the "zero" distance.

For example, in the illustrated embodiment, once the cassette alignment tool system 400 has powered up properly the operator will see three (3) red laser light spots on the reference surface 520. For some laser sensors, it may take up to five seconds for the laser spots to appear. As the laser heads warm up, the distance values displayed for each laser head by the interface controller display 530 (FIG. 7) may fluctuate. To ensure adequate warm up time for the displayed values to stabilize, the interface controller 412 may include a built-in timer which displays a warm-up timing bar at the bottom of a display 530 which may be an LCD display for example. Other types of displays may be used including the display 540 of the computer 416 which may display a graphical user interface (GUI). The warm-up timing bar on the bottom line of the display 530 may be programmed to disappear when the laser heads have warmed up (typically in about five (5) minutes).

When the warm-up is complete the bottom line will display *WARMUP COMPLETED*". At this time, the interface controller display 530 will display the raw distance values next to "blue", "yellow" and "red" labels for each laser's output. As explained in greater detail below, the outputs of the metrology cassette 410 laser sensors are sampled and averaged over a period of time sufficient to substantially cancel out noise and vibration effects.

Figures 6C, 7:
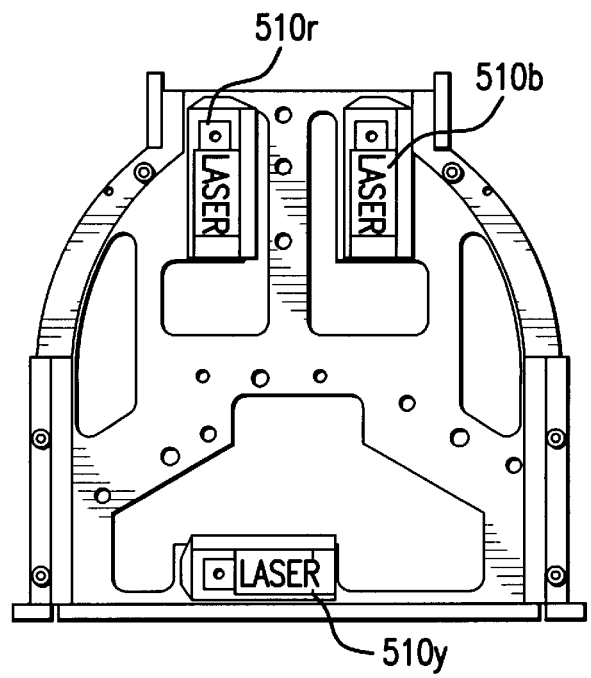
FIG. 7 is a schematic view of the display of the interface controller of the system of FIG. 4.

The operator may now "zero", or calibrate the cassette alignment tool system 400 by pressing a button 532 on the interface controller 412, which is labeled "ZERO". In response, the system assigns the three distance values measured by the three laser heads to be the distance $D_{REF}$ between that laser sensor and the reference surface 520 for each laser head. In that this distance value for each laser is the "zero" distance, the displayed measurement values for each laser head, labeled "blue", "yellow" and "red", are set to indicate 0.000 as shown in FIG. 7. Calibration of the laser sensors is thus completed in a simple manner without requiring any external instruments or tools. It is appreciated that in other embodiments, the internal reference surface for calibrating the distance sensors may be eliminated.

Figure 7A:
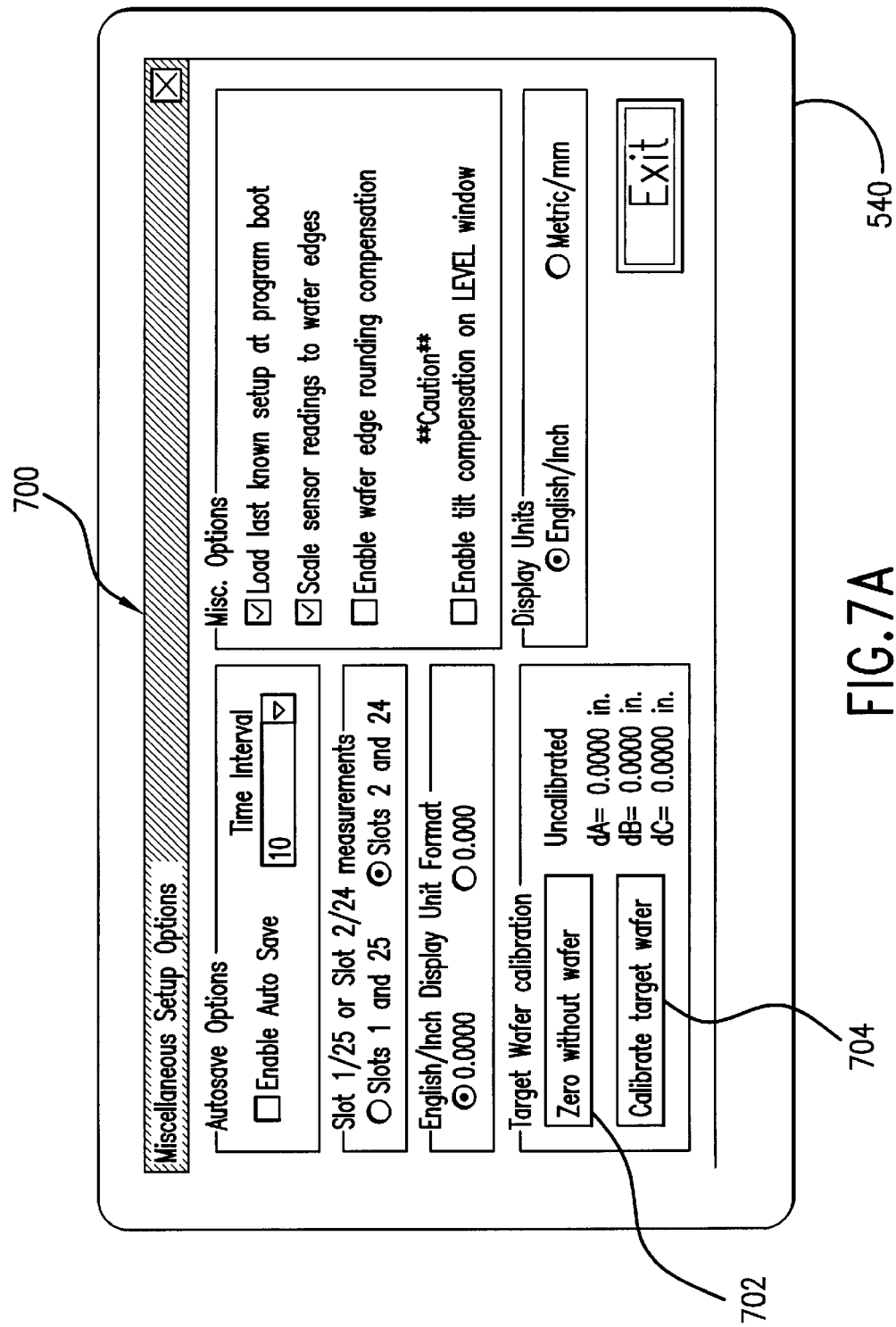
FIG. 7A is a view of the computer display of FIG. 4, depicting an input-output screen used in a calibration procedure.

FIG. 7A shows an example of an input-output screen 700 of a graphical user interface of the display 540 of the computer 416 that may also be used to calibrate the distance sensors. The screen 700 has a "button" 702 labeled "zero without wafer" which may be activated by the operator moving the display cursor over the button 702 and depressing the appropriate mouse or other input device button. Again, in response, the system assigns the three distance values measured by the three laser heads to be the distance $D_{REF}$ between that laser sensor and the reference surface 520 for each laser head. The three distance values dA, dB and dC for the three laser heads A, B and C, respectively, are each assigned an output value of 0.0000 inches as shown in the screen of FIG. 7A.

Although the reference surface 520 of the metrology cassette 410 of the illustrated embodiment is described as being flat and parallel, it is appreciated that other shapes and orientations of reference surfaces and points may be used, depending upon the application. Also, the computer 416 is illustrated as a standard "laptop" size computer. A variety of computing devices may be used including workstations and dedicated processors. The computer 416 preferably has memory including short term and mass storage memory as well as processors and input-output devices including keyboards, printers, display screens and mouse or other pointing devices. The computer 416 is preferably programmed to facilitate the implementation of the procedures discussed herein.

Workpiece Target Surface Calibration

It is recognized that targets being sensed by distance sensors may respond to the distance sensors in different manners. For example, in the illustrated embodiment, laser sensors are used to measure the distance from the sensor to the reference surface 520 and also to measure the distance to a workpiece, which is a silicon wafer in the illustrated embodiment. These sensors operate on the principle of the target having a surface which reflects a light wave emitted by the sensor, back to the sensor. The sensors of the illustrated embodiment emit laser beams in the red visible range. However, a small portion of the emission is in the near-infrared range, and silicon wafers have a degree of transparency to infrared radiation. As a consequence, the infrared portion of the radiation from the laser sensors is typically not reflected by the outermost exterior surface of the silicon wafer but is usually reflected at an internal depth within the silicon wafer. By comparison, the reference surface 520 of the illustrated embodiment has a treated surface which preferably reflects the sensor beam more closely from the actual exterior of the reference surface.

Because the reference surface and the workpiece may respond differently to the sensor beams from the sensors, an error or deviation may be introduced into the measurements of the true distances. The responsiveness of the target surface of the workpiece and the target surface of the reference surface 520 may be measured and compared to determine any such difference which may be expressed as a correction factor. This correction factor may then be applied to distance measurements of the target workpiece to compensate for the manner in which the target workpiece responds to the sensor beams and thereby reduce or eliminate any such error caused by such differences.

To determine the correction factor, the distance sensors are first calibrated in the manner discussed above with no wafer present in the metrology cassette. Thus, the "button" 702 labeled "zero without wafer" of the screen 700 may be activated by the operator moving the display cursor over the button 702 and depressing the appropriate mouse or other input device button. Accordingly, the laser beams emitted by the laser sensors and reflected by the reference surface 520 are sensed to provide the reference distances $D_{REF}$ to the reference surface for each laser head.

Figure 17:
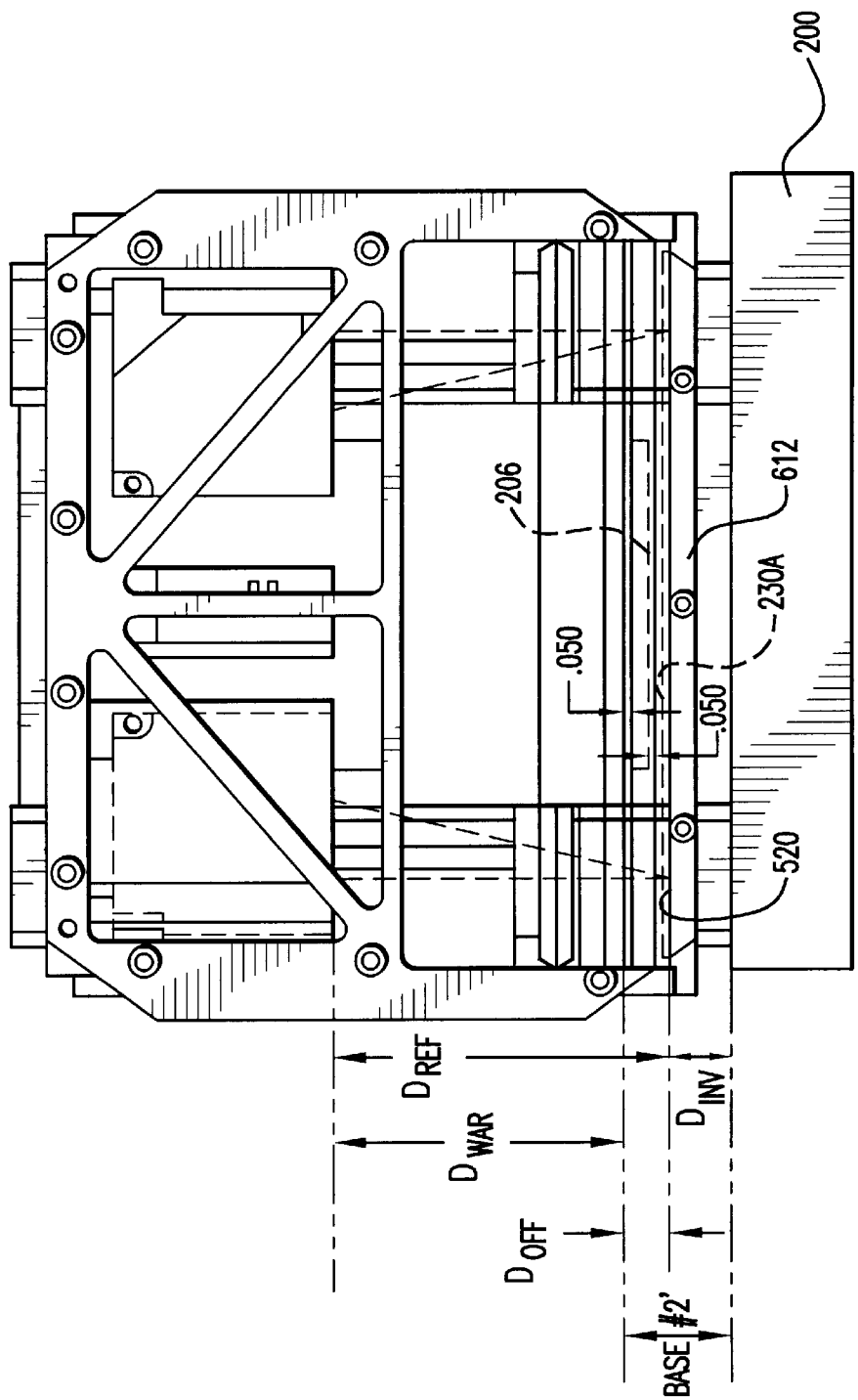
FIG. 17 is a front view of the metrology cassette of FIG. 4, showing the metrology cassette in an inverted position.
Figure 17A:
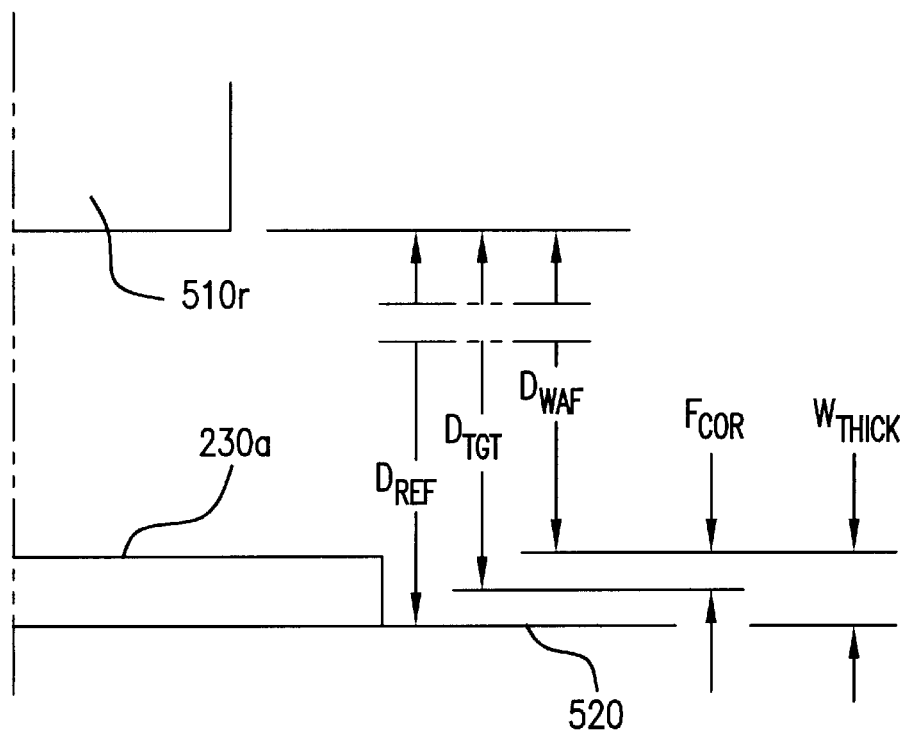
FIG. 17a is a partial schematic view of a wafer resting on the reference surface of the metrology cassette in an inverted position.

The metrology cassette 410 may then be inverted and placed on a suitable supporting surface. In this position, a wafer 230a may be conveniently positioned on and supported by the metrology cassette reference surface 520. In this position, the laser sensing beams are reflected by the wafer 230a rather than the reference surface 520. If the laser beams are reflected by the exterior surface of the wafer, the distance measurement $D_{TGT}$ to the target would change by the thickness $W_{THICK}$ of the wafer. However, because silicon wafers have a degree of transparency to infrared radiation, the measurement of the distance from the sensors to the wafer provides a measurement value $D_{TGT}$ which differs from the previously measured reference distance $D_{REF}$ to the reference surface 520 by a value which is less than the thickness of the wafer as shown in FIG. 17a. By comparing this difference value ($D_{REF}-D_{TGT}$) to the known thickness $W_{THICK}$ of the wafer, the correction factor $F_{COR}$ may be calculated as $F_{COR}=W_{THICK}-(D_{REF}-D_{TGT})$. Thus, upon activating a "calibrate target wafer" button 704 (FIG. 7A), the distance $D_{TGT}$ from the sensors to the wafer is noted for each laser head such as laser head 510r and used with the previously measured reference distance $D_{REF}$ to the reference surface 520 and the known wafer thickness $W_{THICK}$ to calculate the correction factor $F_{COR}$ for each laser head. Subsequent measurements of the distance to the wafer may then be corrected by subtracting the correction factor $F_{COR}$ from the measured distance value $D_{TGT}$ to provide the corrected distance $D_{WAF}$ which is a more accurate representation of the distance from a laser head sensor to the outer surface of the wafer.

Because the response of a target such as a silicon wafer to a distance sensor such as a laser sensor may vary from wafer to wafer, it is preferred that the same wafer be used for subsequent aligning and calibration procedures discussed below. It is appreciated that workpieces other than silicon may be used. These workpieces may simulate an actual wafer but have different reflective and transmissive properties. It therefore should also be appreciated that correction factors may be determined for other types of targets and sensors, correcting for the variations in the manner in which particular targets respond to particular sensors. In addition to placing the target wafer on the reference surface 520 for target surface calibration when the metrology cassette is placed in the inverted position, the target may also be affixed to the reference surface by an appropriate mechanism when the metrology cassette is in the noninverted position.

Cassette Handler Leveling

In aligning a wafer cassette to a robot blade, it is often preferred that the wafer cassette be arranged so that wafers stacked within the cassette are as parallel as possible to a wafer held within the pocket of the robot blade when inserted into the cassette. The parameter affecting this is the alignment of the blade to the cassette slots, which are provided by thin flat or angled shelves or teeth 1912 extending outward from the sidewall of the cassette, and designed to hold the wafers parallel within the cassette. Accordingly, cassette handlers typically have various adjustment mechanisms on the platform 200 of the cassette handler which adjusts the forward/backward and left/right tilt of the platform so that the base of the cassette secured to the platform, and thus the shelves upon which the wafer sits, are oriented parallel to the robot blade. These forward/backward and left/right adjustments to the platform are typically referred to as "leveling" the cassette handler although achieving a true horizontal leveling is typically not the goal. Instead, it is believed that when that wafers stacked within the cassette are as parallel as possible to a wafer held within the pocket of the robot blade when inserted into the cassette, accidental contact between the blade or the wafer held by the blade and the cassette or wafers held within the wafer cassette, may often be reduced or eliminated.

For example, a particular model of cassettes may not hold the wafers parallel to the base of the cassette but may instead tilt the wafers. Thus, in leveling the cassettes to the robot blade, the cassette may be tilted to compensate for wafer tilt angle at which the wafers are tilted by the cassette itself.

However, the leveling operations described herein may be used to achieve other orientations between the cassette and the robot blade, depending upon the particular application. For example, in the illustrated embodiments as described below, the cassettes may be aligned so as to compensate not only for the wafer tilt angle inherent in the cassette model but also for changes to the tilt angle of the cassette elevator as the cassette is elevated between various elevated positions.

Figure 19:
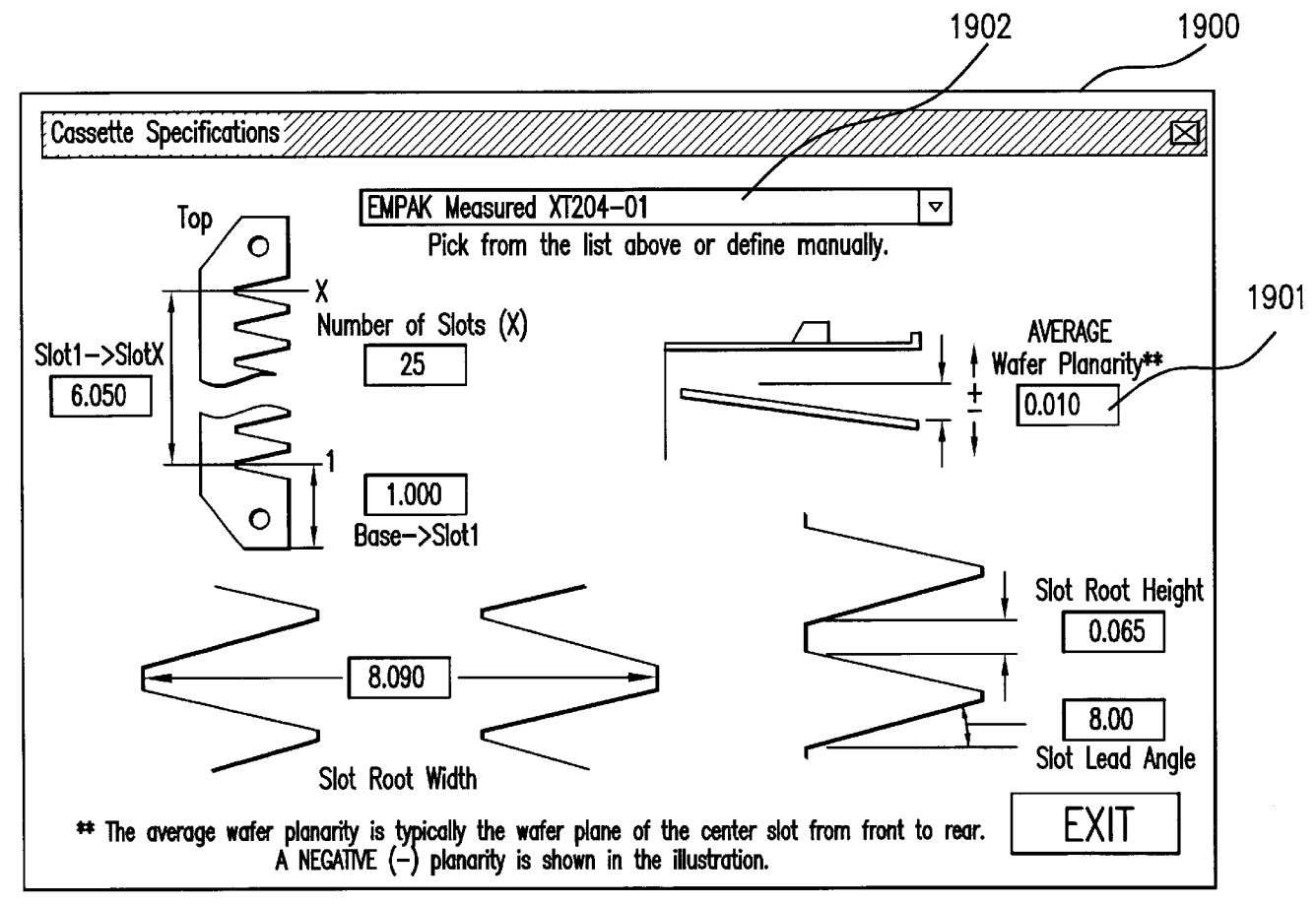

In one embodiment, the wafer tilt angle at which wafers are stored for a particular cassette model may be determined based upon the specification data often supplied by the manufacturer of that model. The values of these specifications may be inputted manually into a Cassette Specifications input screen 1900 shown in FIG. 19. A date entry point for a wafer tilt angle value is indicated generally at 1901 in FIG. 19. In this embodiment, the angle at which a particular cassette or cassette model tilts the wafers may be represented by a vertical displacement $T_{OFFSET}$ at the front edge of the wafer. In the example of FIG. 19, the wafer cassette model tilts the wafers so that the front edge of each wafer is vertically displaced downward a distance $T_{OFFSET}$=0.010 inches relative to the rear edge of each wafer. The cassette alignment tool system may also be programmed to provide these values automatically in response to the operator inputting the model of the wafer cassette at an input box 1902 of the input screen 1900.

In addition, individual cassettes of a population of cassettes may be directly measured using test wafers for example. An average, median or other representative wafer tilt angle may then be determined based upon the test data for that population of cassettes, and entered into the data entry point 1901 of the input screen 1900 expressed as a vertical displacement $T_{OFFSET}$. If the cassette holds the wafers without any tilt angle, the vertical displacement $T_{OFFSET}$ for that cassette or population of cassettes would be equal to zero, that is no vertical displacement.

Once the wafer tilt angle of the cassette or population of cassettes has been determined and inputted, the actual tilt angle of the metrology cassette 410 relative to a wafer being held by the robot blade, may be measured by the system and compared to the wafer tilt angle. The tilt angle of the metrology cassette 410 may then be adjusted until it matches or otherwise compensates for the predetermined wafer tilt angle for the population of cassettes designated for use with the cassette handler. In addition, the tilt angle of the elevator may be compensated for as well. In this manner, the metrology cassette may be aligned relative to the robot blade such that when an actual cassette is installed in the cassette handler, the wafer held by the robot blade will be generally parallel to the stack of wafers held within the cassette (or at another desired angle of orientation) even if the tilt angle changes as the elevator elevates the cassette.

The cassette alignment tool system 400 in accordance with a preferred embodiment of the present invention thus readily permits the cassette handler to be "leveled" relative to the wafer blade both quickly and very accurately, compensating for the tilt angle of the elevator. The cassette alignment tool system 400 of the illustrated embodiments accurately measures the left/right and forward/back displacements of a robot blade carrying a wafer relative to the reference plane 520 of the metrology cassette 410 and provides a numerical output indicating both the direction and amount of each displacement. Once the measured displacement matches the desired displacement, a zero or other visual indicator indicates to the operator that a match has been achieved. In this manner, the operator can readily adjust the cassette handler until the system 400 indicates that the amount of left/right and front/back displacements are zero or otherwise within tolerance. The following provides an example of such a cassette handler leveling operation for a typical loadlock chamber designated "LLA".

Figure 1:
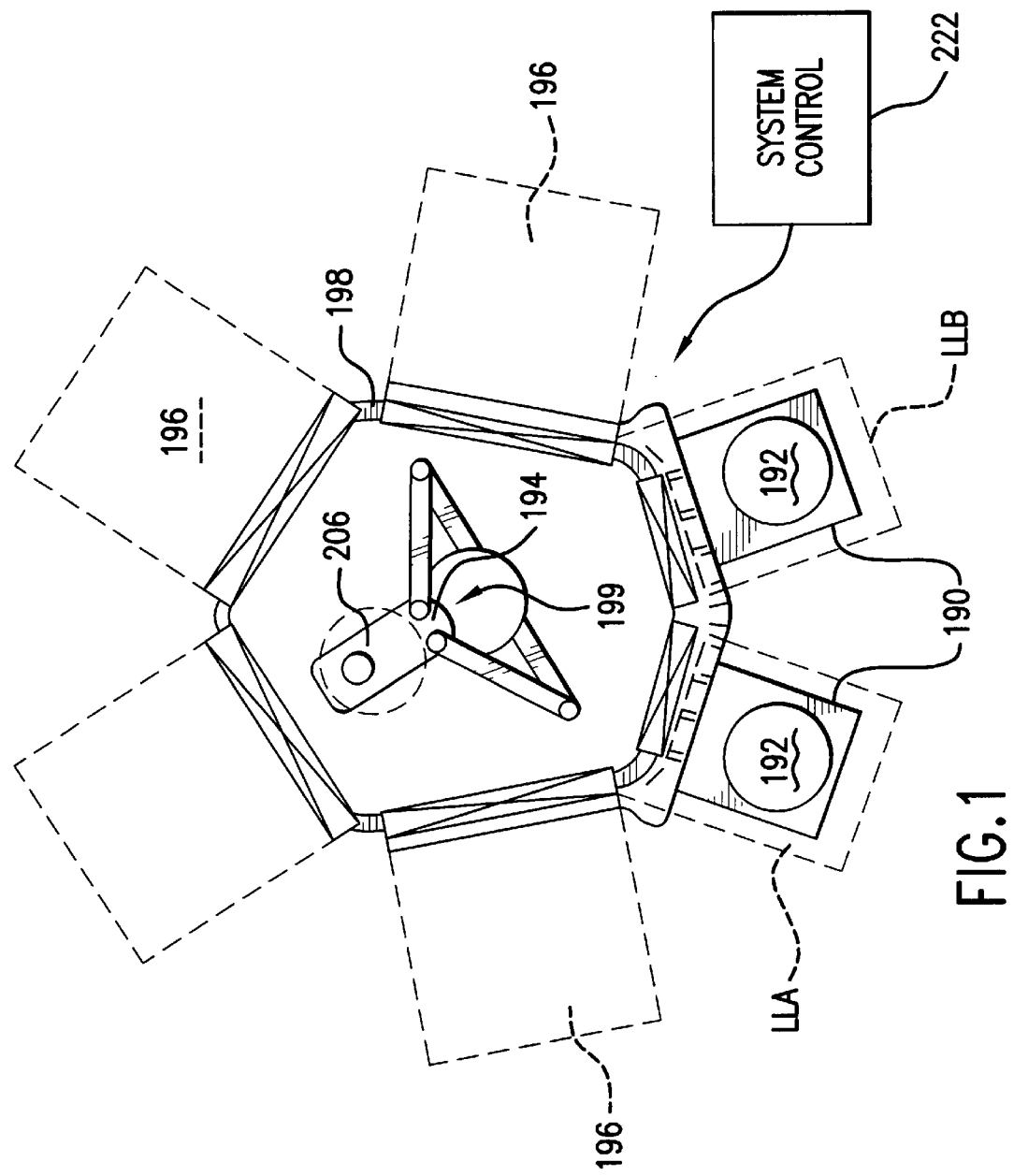
FIG. 1 is a schematic top view of a typical deposition chamber having two loadlock chambers.
Figure 2:
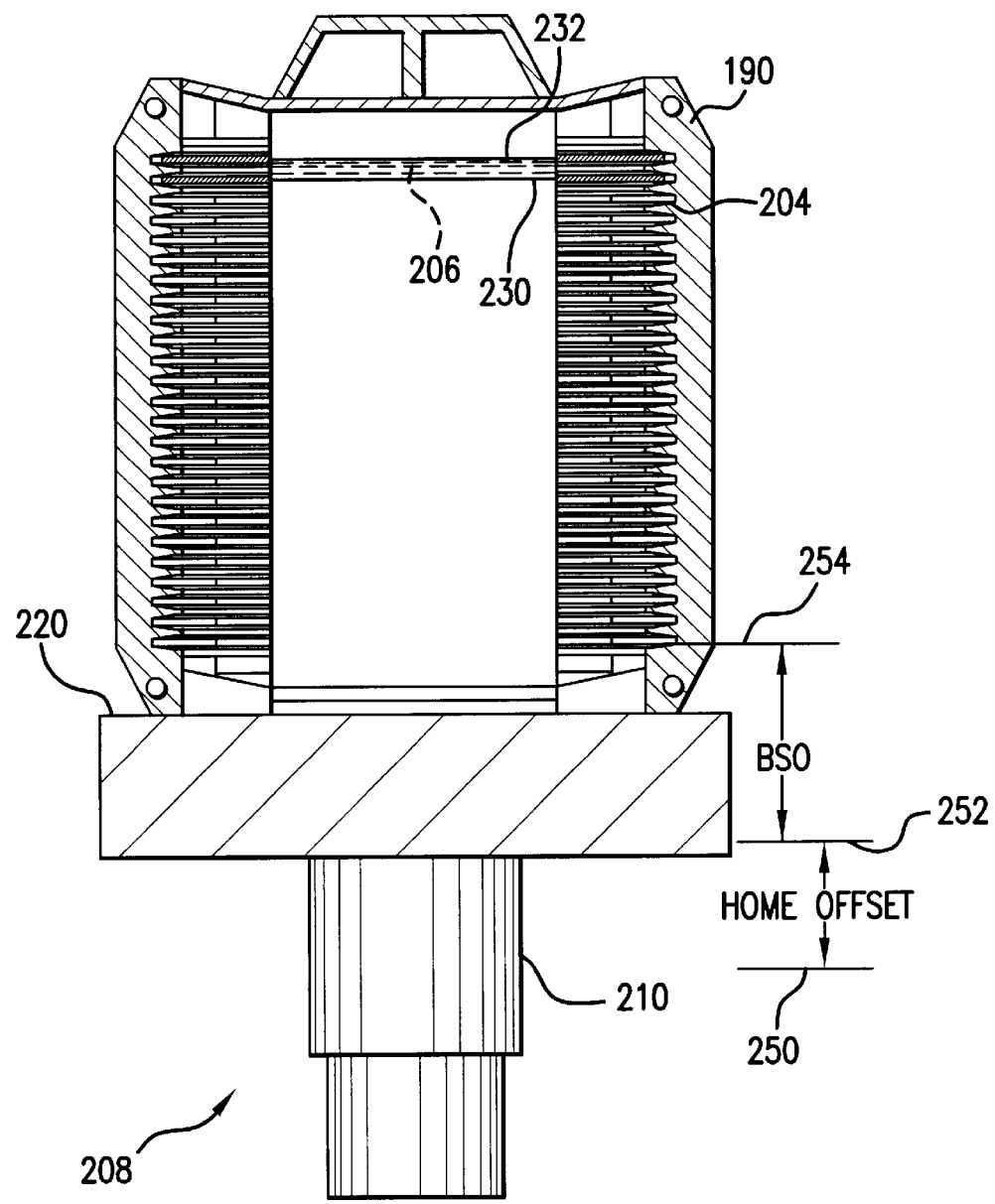
FIG. 2 is a schematic front view of a typical wafer cassette disposed on a platform of a cassette handling system.
Figure 3:
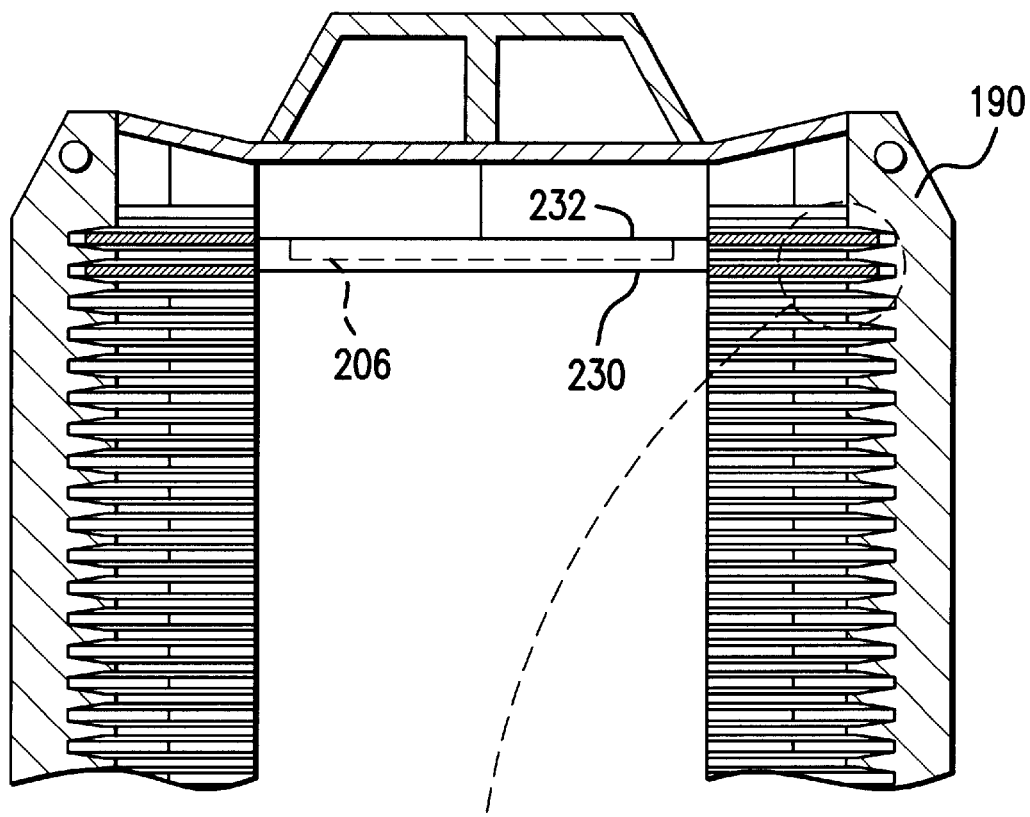
FIG. 3 is a partial view of the wafer cassette of FIG. 2, depicting a wafer resting in a slot and a wafer picked up from a slot.
Figure 3A:
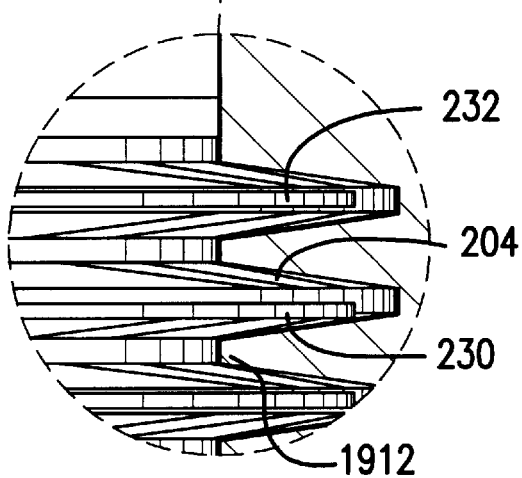
FIG. 3A is an enlarged partial view of the wafer cassette of FIG. 3, depicting a wafer resting in a slot and a wafer picked up from a slot.
Figure 8:
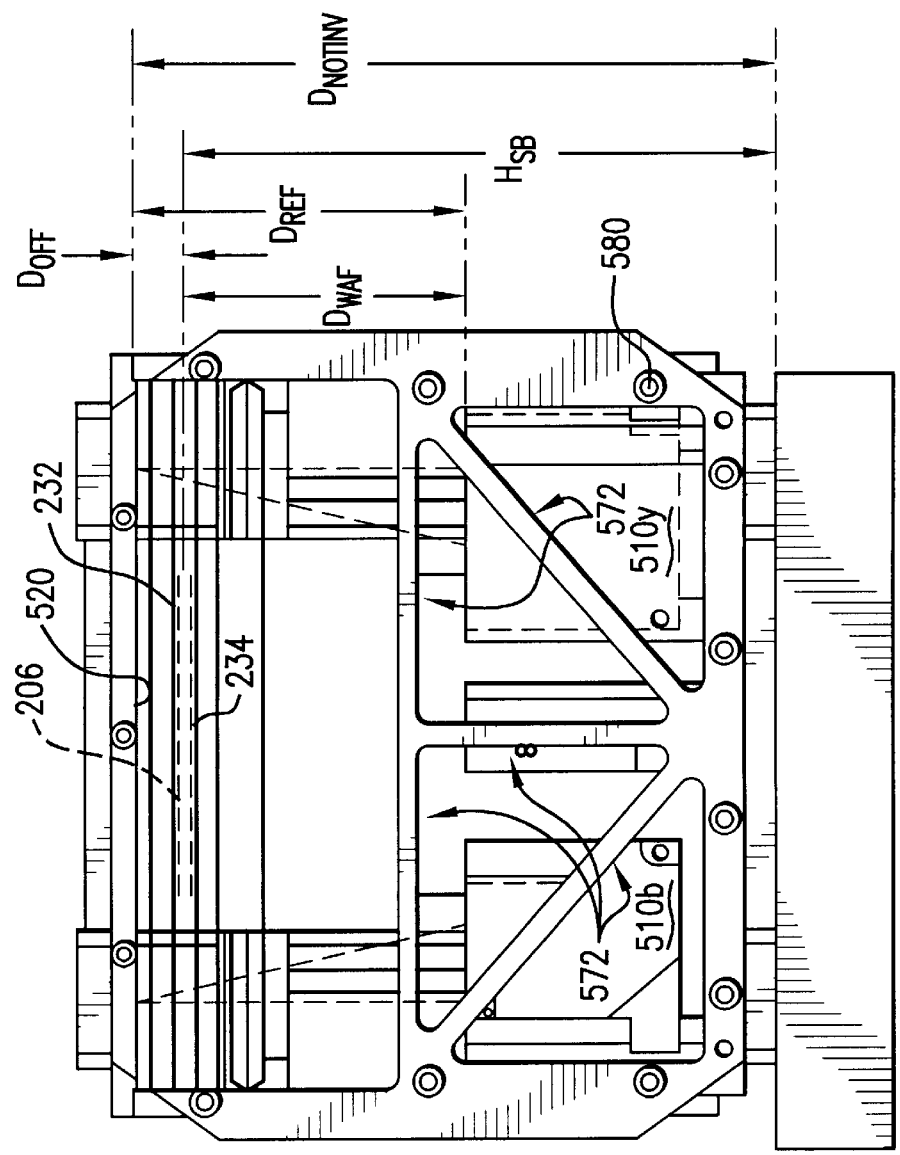
FIG. 8 is a front view of the metrology cassette of FIG. 4.

To ready the cassette alignment tool system 400 for the cassette leveling procedure, the operator causes the processing system controller to move the loadlock "LLA" cassette handler to slot base #24. The robot blade is then extended to the Drop Position/Pick Position of loadlock "LLA" so that the operator can place a clean wafer in the blade pocket. To facilitate light beam reflection by the wafer, it is preferred that the mirror side of the wafer be placed face up, with the dull silver side down to face the laser sensors. The robot blade is then retracted back in the transfer chamber to the zero position, with the wafer properly in the robot blade pocket. The metrology cassette 410 of the cassette alignment tool system 400 is then placed on the loadlock "LLA" cassette handler platform in the same manner as a standard plastic cassette. Thus, the metrology cassette 410 is placed on the handler with the top plate 612 up as shown in FIG. 8 and the cassette alignment surfaces such as the H-bar 430 of the bottom plate 630 properly registered with the handler alignment surfaces of the platform 200. Using the system controller, the loadlock "LLA" cassette handler moves the metrology cassette 410 to "slot base 24". The "slot base" position is the cassette position relative to the robot blade in which the blade is preferably midway between two wafers resting in consecutive slots. For example, FIG. 2 illustrates the slot base 25 position for wafer cassette 190 which is the vertical position of the wafer cassette 190 when the robot blade 206 is midway between two wafers 230 and 232 in resting in consecutive slots 24 and 25, respectively, of the wafer cassette 190. The metrology cassette 410 of the illustrated embodiment does not have actual slots for supporting wafers. However, in that the metrology cassette 410 is emulating the wafer cassette 190, the positions of the wafer slots formed between adjacent shelves for a production cassette can be readily supplied from the cassette manufacturer, in terms of a distance offset relative to the reference plane 520. Thus, for this leveling procedure, FIG. 8 shows the effective slot base 24 position for the metrology cassette 410 when the robot blade 206 is midway between two imaginary wafers 234' and 232' resting in consecutive imaginary slots 23 and 24, respectively, of the metrology cassette 410.

The operator may visually check the location of the metrology cassette 410 and the cassette handler to ensure that it is at "slot base 24" for load lock "LLA". The cassette alignment tool system 400 may then be calibrated by pushing the Zero button on the cassette alignment tool system 400 controller as described above to ensure that "L/R" and "F/B" displayed values on the display 530 of the interface controller are both reading 0.0000 as shown in FIG. 7. The L/R displayed value is the difference between the distance measurements of the blue and yellow laser heads 510$b$ and 510$y$, respectively, which are disposed on the left and right, respectively as shown in FIG. 6A. The F/B reading is the difference between the averaged distance measurement of the blue and yellow laser heads 510$b$ and 510$y$, respectively, which are disposed in the front of the metrology cassette 410, and the red laser head 510$r$ which is disposed in the back of the metrology cassette 410 as shown in FIG. 6A. Because the robot blade and wafer have not yet been extended into the metrology cassette 410, the light beams of the laser distance sensors will intercept the cassette reference surface 520. As previously mentioned, the distance measurements of the three lasers to the flat, parallel reference surface 520 during the "zeroing" operation are calibrated to be output as zero. Thus, the difference between the left and right laser distance measurements is assigned an L/R output of zero and the difference between the front and back laser distance measurements is assigned an F/B output of zero.

Following calibration of the lasers, the robot blade and wafer may be extended into the cassette alignment tool system 400 metrology cassette 410 preferably making sure there is no contact from the robot blade and wafer with any part of the cassette alignment tool system 400 metrology cassette 410. The robot blade and wafer may be stopped at the "wafer drop" position which is the position at which the blade drops a wafer into a slot or picks a wafer up from a slot. Transfer robot movements are typically commanded through a processing system controller.

Figure 11:
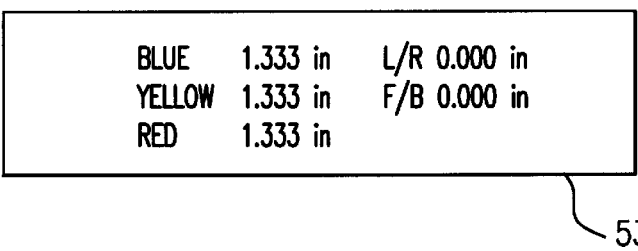
FIG. 11 is a schematic view of the display of the interface controller of the system of FIG. 4, during a wafer height measurement procedure.

After the robot blade is moved into the cassette, the distance $D_{WAF}$ (FIG. 8) from each laser sensor to three areas on the bottom surface of the wafer on the robot blade is measured by the three sensors. After allowing a couple of seconds for the reading on the display 530 of the interface controller to stabilize, the outputs labeled "L/R" and "F/B" may be noted. The measured offset distances $D_{OFF}$ from the reference surface 520 to the wafer ($D_{REF}-D_{WAF}$) may then be displayed for each laser head as shown in FIG. 11. In the example of FIG. 11, the offset distance $D_{OFF}$ for each laser sensor is displayed as 1.333. The measured offset distance $D_{OFF}$ for each laser sensor will be the same for each sensor if the robot blade is parallel to the cassette reference surface 520. In the example of FIG. 11, the wafer tilt angle of the cassette represented by the metrology cassette 410 is zero, that is, the wafers are not tilted at an angle in the actual cassette. Thus, the wafer tilt angle as represented by the vertical displacement $T_{OFFSET}$ is likewise zero in this example.

Figure 12A:
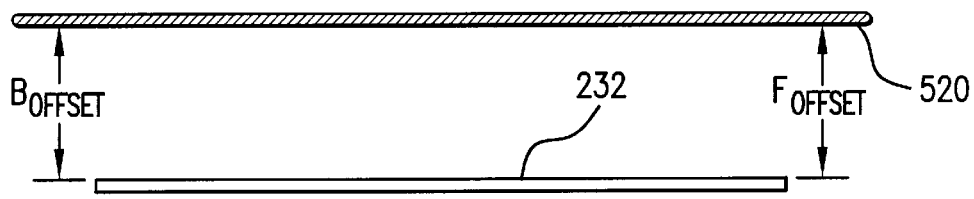
FIG. 12a is a schematic side view of a wafer held parallel to the reference surface of the metrology cassette of FIG. 4.
Figure 12B:
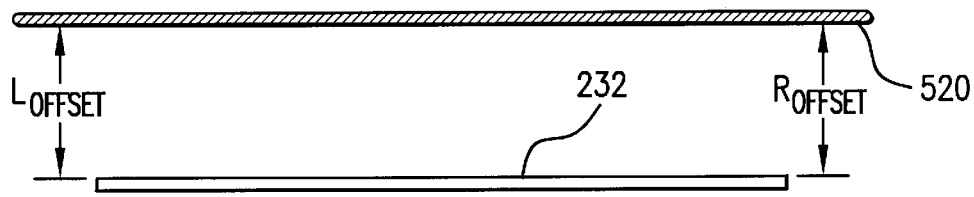
FIG. 12b is a front view of a wafer held parallel to the reference surface of the metrology cassette of FIG. 4.

FIGS. 12A and 12B show a wafer 232 held parallel to the cassette reference surface 520. This example represent a cassette in which the wafer tilt angle $T_{OFFSET}$ is equal to zero. There, the offset distance $F_{OFFSET}$ from the front of the wafer 232 to the reference surface 520 and the offset distance $B_{OFFSET}$ from the back of the wafer 232 to the reference surface 520 will be the same, that is, $F_{OFFSET}=B_{OFFSET}$. The wafer tilt angle $T_{OFFSET}$ is the difference between front offset $F_{OFFSET}$ and the back offset $B_{OFFSET}$. Thus, in the example, of FIGS. 11, 12A and 12B, $F_{OFFSET}-B_{OFFSET}=T_{OFFSET}=0$.

As set forth above, The F/B reading of the display 530 is the difference between the averaged distance measurement of the blue (front-left) and yellow (front-right) laser heads 510$b$ and 510$y$, respectively, and the distance measurement of the red laser head 510$r$ which is disposed in the back of the metrology cassette 410 as shown in FIG. 6A. Thus, the F/B displayed value will be 0.0000 as shown in FIG. 11 if the cassette is level (parallel to the robot blade) in the front-back direction as shown in FIG. 12A.

FIG. 12B is a front view of a wafer 232 held parallel to the cassette reference surface 520. There, it is seen that the offset distance $L_{OFFSET}$ from the left of the wafer 232 to the reference surface 520 and the offset distance $R_{OFFSET}$ from the right side of the wafer 232 to the reference surface 520 will be the same, that is, $L_{OFFSET}=R_{OFFSET}$. Thus, in the example, of FIGS. 11, 12A and 12B, $L_{OFFSET}-R_{OFFSET}=0$. Since the L/R displayed value of FIG. 11, is the difference between the distance measurements of the blue (front-left) and yellow (front-right) laser heads 510$b$ and 510$y$, respectively, which are disposed on the left and right, respectively as shown in FIG. 6A, the L/R displayed value will be 0.0000 if the cassette is "level" (parallel to the robot blade) in the left-right direction. Thus, if the cassette is leveled to the robot blade both the F/B AND L/R readings will be 0.0000. If not, the cassette will need to be leveled relative to the robot blade.

Figures 13, 14B:
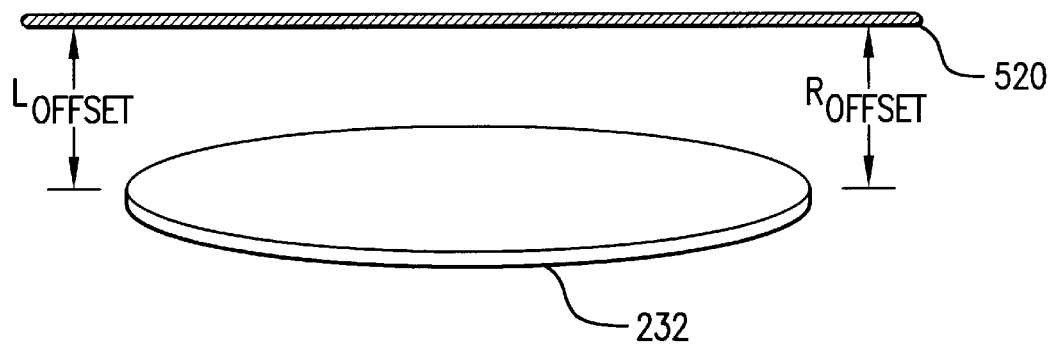
FIG. 13 is a schematic view of the display of the interface controller of the system of FIG. 4, during a wafer height measurement procedure.
FIG. 14b is a schematic front view of a wafer orientation measurement procedure of FIG. 4.
Figure 14A:
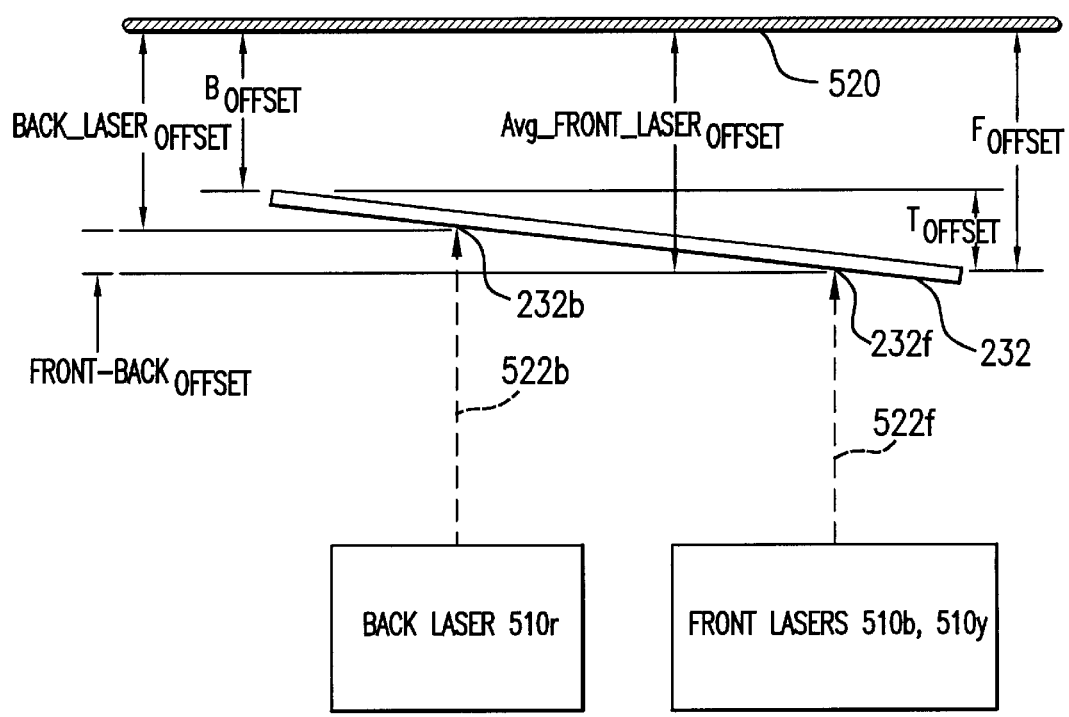
FIG. 14a is a schematic side view of a wafer orientation measurement procedure of FIG. 4.

FIGS. 13, 14A and 14B show another example in which the measured offset distance $D_{OFF}$ for each laser sensor is not the same. In this example, the predetermined wafer tilt angle of the cassette represented by the metrology cassette 410 is nonzero, that is, the wafers are tilted at an angle in the cassette. Thus, the wafer tilt angle as represented by the vertical displacement $T_{OFFSET}$ is nonzero, such as 0.010 inches in the example of FIG. 19. If it is desired to compensate the cassette orientation relative to the robot blade for the wafer tilt angle of the cassette, the system may be so instructed by "clicking" the box adjacent the input "Enable cassette wafer plane compensation" input indicated at 1500 of the input screen 1502 of FIG. 15.

FIGS. 14A and 14B show a wafer 232 held nonparallel to the cassette reference surface 520. This example represents a cassette in which the wafer tilt angle $T_{OFFSET}$ is nonzero. Hence, the front offset distance $F_{OFFSET}$ from the front of the wafer 232 to the reference surface 520 and the offset distance $B_{OFFSET}$ from the back of the wafer 232 to the reference surface 520 will not be the same. Since the wafer tilt angle $T_{OFFSET}$ is the difference between front offset $F_{OFFSET}$ and the back offset $B_{OFFSET}$, $F_{OFFSET} - B_{OFFSET} = T_{OFFSET}$ which is equal to 0.010 inches in the example, of FIG. 19.

As set forth above, the F/B reading of the display 530 is the difference between the averaged distance measurement of the blue (front-left) and yellow (front-right) laser heads 510b and 510y, respectively, which are disposed in the front of the metrology cassette 410, and the distance measurement of the red laser head 510r which is disposed in the back of the metrology cassette 410 as shown in FIG. 6A. When the wafer 232 is tilted at an angle in the front to back direction relative to the reference surface 520, the average offset distance Avg_Front_Laser$_{OFFSET}$ of the offset distances measured by the front laser sensors 510b, 510y will differ from the offset distance Back_Laser$_{OFFSET}$ measured by the back laser 510r. The offset distance Avg_Front_Laser$_{OFFSET}$ is the average of the offset distances from the reference surface 520 to the wafer points 232f at which the laser beams 522f from the front laser sensor 510b, 510y reflect from the surface of the wafer 232. In a similar manner, the offset distance Back_Laser$_{OFFSET}$ is the offset distance from the reference surface 520 to the wafer point 232b at which the laser beam 522b from the back laser sensor 510r reflects from the surface of the wafer 232. The difference between the measured offset distance Avg_Front_Laser$_{OFFSET}$ and the measured offset distance Back_Laser$_{OFFSET}$ may be represented by the differential offset distance Front-Back$_{OFFSET}$ as shown in FIG. 14A. If the wafer 232 is tilted at an angle in the front to back direction so that the front edge of the wafer is displaced the offset distance of $T_{OFFSET}$, the expected value of the differential offset distance Front_Back$_{OFFSET}$ referred to herein as Wafer_Tilt_Front-Back$_{OFFSET}$ may be calculated trigonometrically since the wafer diameter, the sensed wafer positions 232f, 232b and the offset distance $T_{OFFSET}$ of the actual cassette or population of cassettes are known. The expected differential offset distance value Wafer_Tilt_Front-Back$_{OFFSET}$ may be subtracted from the measured differential offset distance Front-Back$_{OFFSET}$ to determine the displayed F/B value. The closer the front to back angle of the cassette 410 is to the desired wafer tilt angle, the closer the displayed F/B value will be to zero. In other words, the F/B displayed value will be 0.0000 as shown in FIG. 13 if the cassette is tilted at the wafer tilt angle in the front-back direction as shown in FIGS. 14A, 14B.

FIG. 14B shows another view of a wafer 232 angled relative to the reference surface 520 in the front-back direction but not tilted in the left-right direction. There, it is seen that the offset distance $L_{OFFSET}$ from the left of the wafer 232 to the reference surface 520 and the offset distance $R_{OFFSET}$ from the right side of the wafer 232 to the reference surface 520 will be the same, that is, $L_{OFFSET} = R_{OFFSET}$. Thus, in the example, of FIGS. 13, 14A and 14B, $L_{OFFSET} - R_{OFFSET} = 0$. Since the L/R displayed value of FIG. 13, is the difference between the distance measurements of the blue (front-left) and yellow (front-right) laser heads 510b and 510y, respectively, which are disposed on the left and right, respectively as shown in FIG. 6A, the L/R displayed value will be 0.0000 if the cassette is "level" (parallel to the robot blade) in the left-right direction. Thus, if the cassette is leveled to the robot blade in the left-right direction but tilted at the wafer tilt angle in the front-back direction, both the F/B AND L/R readings will be 0.0000. If not, the cassette will need to be reoriented relative to the robot blade.

The cassette handler of the illustrated embodiment has three leveling screws which may be individually adjusted to change the front/back and left/right orientation of the platform 200, and thus the cassette to the robot blade. These leveling screws are graphically represented in a convenient computer display output 800 shown in FIG. 9, the relevant portion of which is shown in an enlarged view in FIG. 10. As shown therein, the three leveling screws are labeled #1, #2 and #3, respectively.

The following provides an example of use of a cassette alignment tool in accordance with an embodiment of the present invention for leveling a cassette handler. Of course, the procedure may be readily modified to accommodate the particular leveling adjustment mechanism of the particular handler being used.

First, the operator levels the handler in the front to back (F/B) direction by adjusting the slotted screw labeled #1 about ¼ of a turn clockwise (CC) for example, and allowing the F/B measurement displayed by the interface controller display 530 (FIG. 11) to stabilize after the change. If the F/B reading becomes a smaller value (closer to the 0.000), the operator should continue to adjust the #1 screw until the F/B becomes 0.000. If the display F/B value becomes larger, the operator can turn the #1 screw counterclockwise (CCW). It is preferred that the operator make small adjustments, waiting for the display reading to stabilize before the operator makes the next adjustment. Once the F/B reading becomes 0.000, the cassette reference surface will be parallel to the robot blade in the front-back direction if the cassette being represented has no wafer tilt angle ($T_{OFFSET}$=zero), or the cassette reference surface will be tilted relative to the robot blade to match the cassette wafer tilt angle ($T_{OFFSET}$= nonzero) as input at input screen 1900 of FIG. 19.

Next, the handler may be leveled in the left to right (L/R) direction by adjusting the slotted screw labeled #3 using the same method of adjustment described above. The operator preferably should not need to adjust slotted screw #2 unless the operator cannot level the cassette within the desired tolerance such as 0.0020, for example, in both the F/B and L/R directions. When both of the F/B and L/R readings are 0.0020 or better, the cassette platform is at the desired orientation relative to the robot blade.

As previously mentioned, the metrology cassette 410 is emulating the wafer cassette 190. In that the dimensions of the blade, wafer and wafer cassette are known or can be measured, a preferred slot base position can be calculated for each slot base of the cassette 190. Such a preferred slot base position for slot base 24 is represented as a height $H_{sb}$ (FIG. 8) above the plane of the base plane 220 of the platform 200. Similarly, the calculated preferred slot base position may be represented as an offset distance $D_{sb}$ from the cassette reference surface 520.

To facilitate leveling the cassette relative to the robot blade, the laser distance measurements by the laser sensors to the underside of the wafer held by the robot blade relative to the reference surface 520 when the robot blade is inserted into the cassette may be output to the operator as displacements from the calculated preferred slot base position $D_{sb}$ measured from the cassette reference surface 520.

Figure 9:
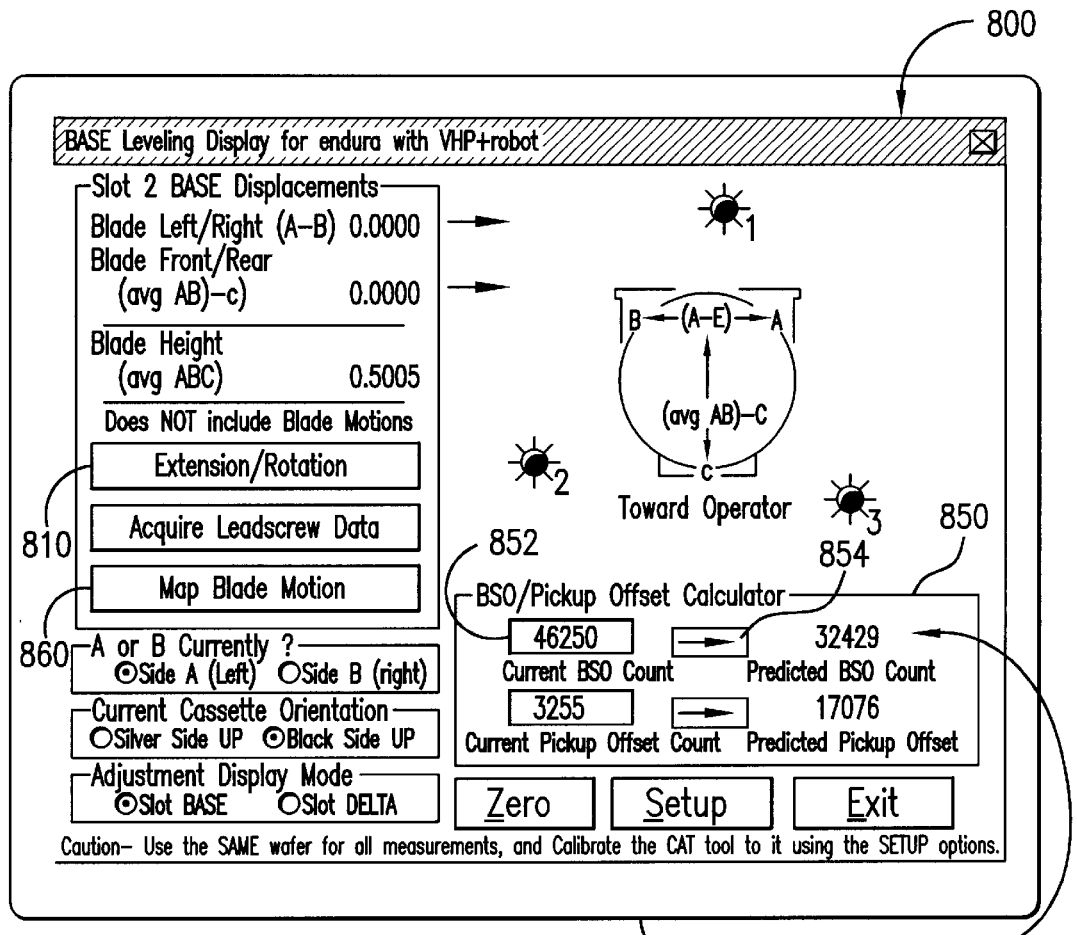
FIG. 9 is a view of the computer display of FIG. 4, depicting an input-output screen used in a leveling procedure.
Figure 10:
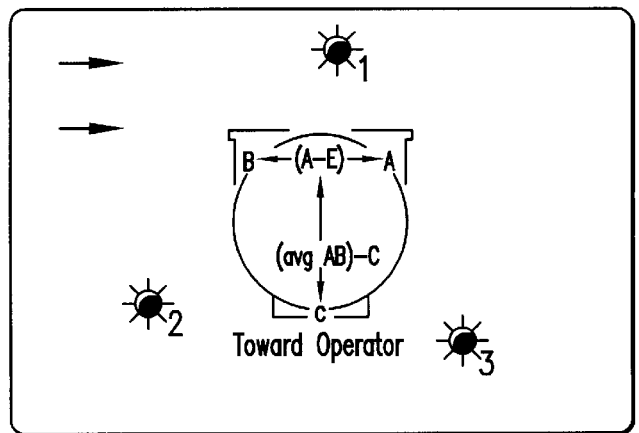
FIG. 10 is an enlarged view of a portion of the screen of FIG. 9, graphically depicting the leveling inputs for a typical cassette handler platform.

FIG. 9 shows the computer display screen 800 having an output labeled "Blade Left/Right (A-B)" which is similar to the L/R output of the interface controller display discussed above. However, the displayed value "A-B" is the difference between the two displacements, one measured by the blue (left) laser 510b and one measured by the yellow (right) laser 510y, from the calculated preferred slot base position $D_{sb}$. Another output labeled "Blade Front/Rear (avg AB)-C)" is similar to the F/B output of the interface controller display but the value "C" is the displacement measured by the red (back) laser 510r, from the calculated preferred slot base position $D_{sb}$. If the cassette is leveled to the robot blade (that is parallel if the wafer tilt angle is zero, or angled as a function of the wafer tilt angle if the wafer tilt angle is nonzero), both readings will be 0.0000 because the displacements from the preferred slot base position will be zero for each laser, indicating a level condition. If not, the operator can level the cassette to the robot blade in the same manner described above, adjusting the leveling screws until the desired 0.0000 readings (or within tolerance) are obtained.

Elevator Tilt Characterization

In accordance with one aspect of the illustrated embodiment, the cassette alignment tool system 400 of the illustrated embodiment provides an apparatus and a method for compensating for elevator axis runout or other deviation in the motion of the elevator of the cassette handler. These elevators often include a leadscrew or other mechanism for lifting and lowering the cassette. Typically, a leadscrew mechanism includes a threaded shaft, which is coupled to a nut fixed against rotation and coupled to the cassette handler platform. Rotation of the shaft causes linear motion of the nut, and thus of the handler. The leadscrew is commanded by the operator system to elevate the cassette in steps. The actual linear distance moved by the leadscrew is referred to as the leadscrew "pitch" and is expressed in steps per inch (or steps per millimeter if metric). Unfortunately, the leadscrew or other elevator shaft may become bent or the mechanism worn such that the elevator mechanism does not lift the cassette in a truly linear fashion. Instead, the cassette may tilt to one side as the cassette moves from one slot position to another. Hence, if the cassette is aligned with respect to the robot blade at one slot position, it may be misaligned at an upper or lower slot position due to the elevator tilt.

Here, the cassettes may be aligned so as to compensate for tilt exhibited by an elevator shaft as the cassette is elevated between various slot positions. For example, the cassette tilt angle of the metrology cassette 410 may be measured relative to the robot blade at a first slot position of the cassette 410, such as slot base 2. After activating the elevator 210 to raise the cassette 410 to a second slot position, preferably near the other end of the cassette, such as slot base 24, for example, the tilt angle of the metrology cassette 410 may be measured again. If the tilt angle has changed, such change has likely been induced by the elevator 210. In the illustrated embodiment, the tilt angle of the cassette relative to the robot blade may be adjusted as a function of the measured angle at which the elevator shaft tilts the cassette as the cassette is raised or lowered to reduce accidental breakage or damaging of cassettes. Such an elevator tilt angle adjustment may be combined with a desired wafer tilt angle adjustment as described above, to provide a final orientation of the cassette relative to the robot blade. The adjustments to the cassette orientation as a result of both the elevator tilt angle and the wafer tilt angle, may be additive or negating, either in whole or in part, depending upon the respective directions of the measured tilt angle of the elevator and the wafer tilt angle of the cassette being emulated.

Figure 15:
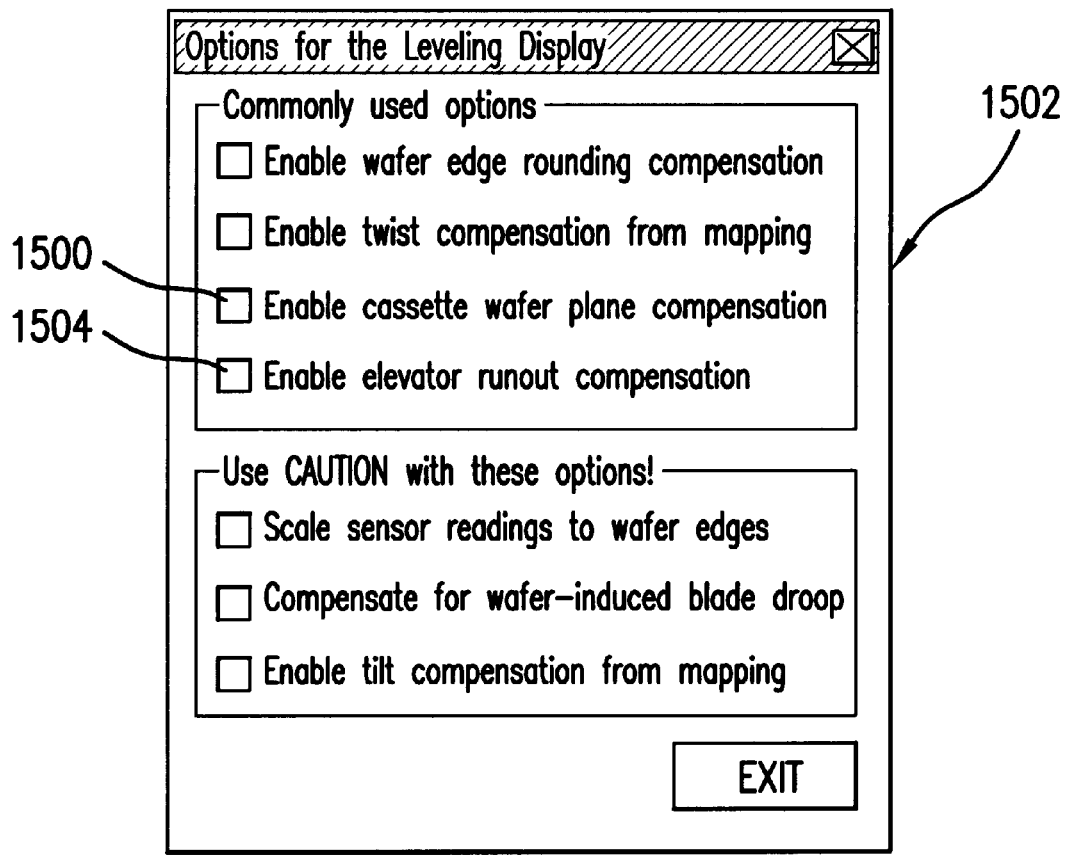
FIG. 15 is a view of the computer display of FIG. 4, depicting an input-output screen used in a wafer plane compensation procedure and an elevator tilt compensation procedure.
Figure 16A:
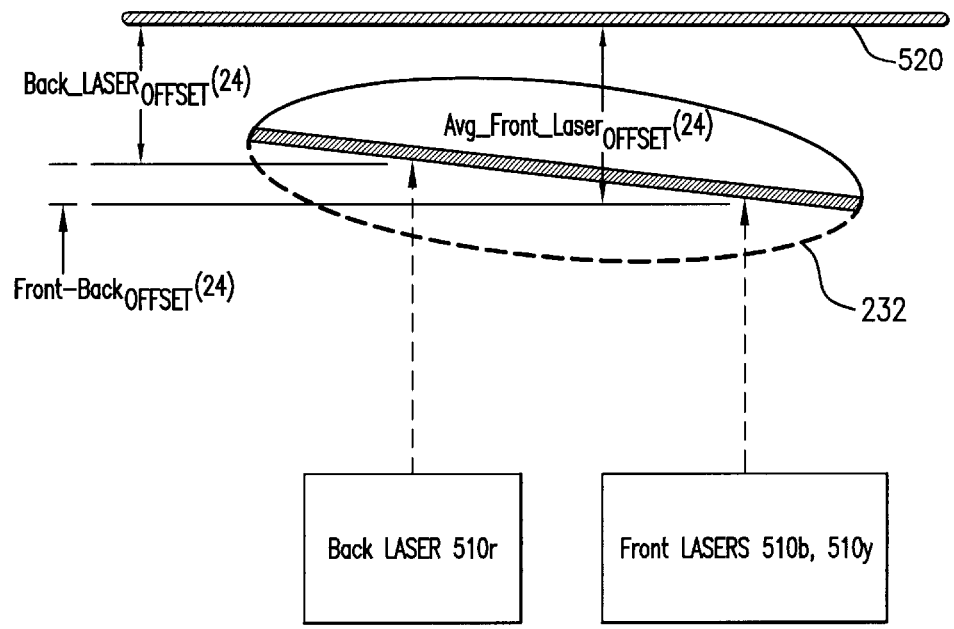
FIG. 16a is a schematic side view of a wafer orientation measurement procedure at a first elevator height.
Figure 16B:
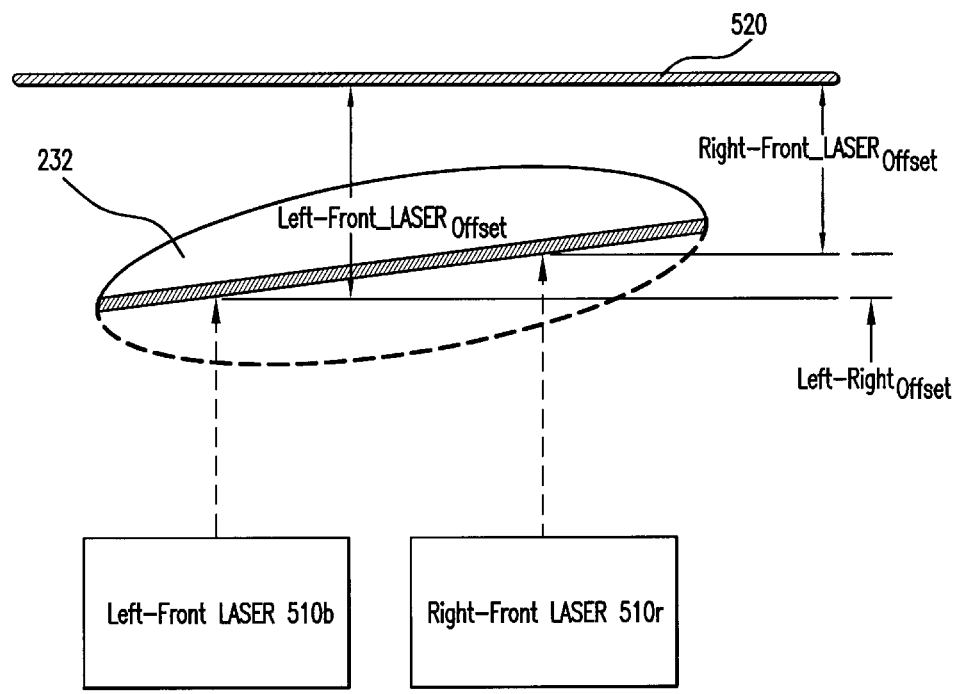
FIG. 16b is a schematic front view of a wafer orientation measurement procedure at the first elevator height.
Figure 18:
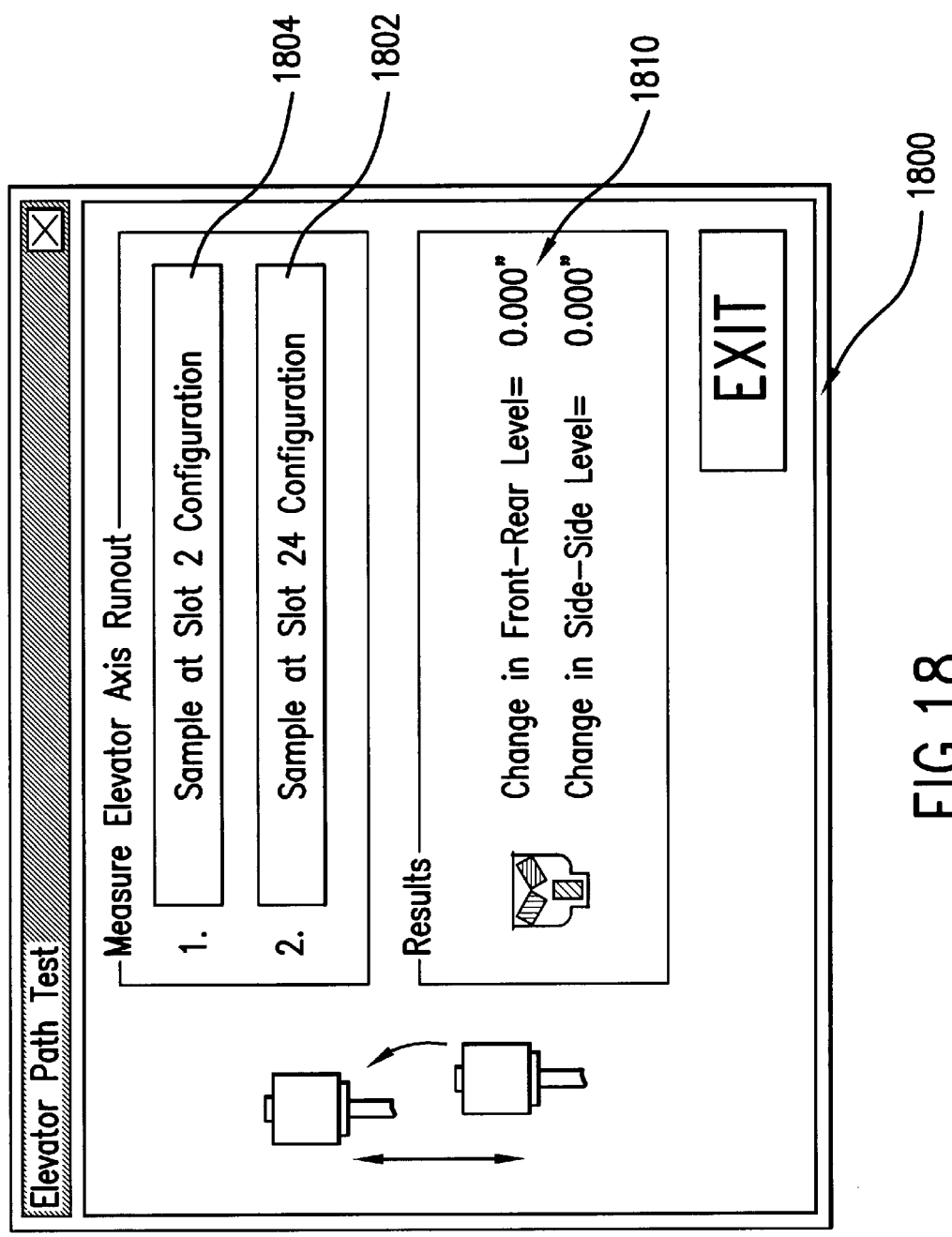
FIG. 18 is a view of the computer display of FIG. 4, depicting an input-output screen used in an elevator tilt angle characterization procedure.

In the illustrated embodiment, if it is desired to compensate the cassette orientation relative to the robot blade for the elevator tilt angle, the system may be so instructed by "clicking" the box adjacent the input "Enable elevator runout compensation" input indicated at 1504 of the input screen 1502 of FIG. 15. To measure the elevator tilt angle, the operator may measure the orientation of the wafer carried by a robot blade relative to the reference plane 520 and record the orientations in two elevator positions, for example, slot base 2 and slot base 24. FIG. 18 shows an input screen 1800 for the computer 416. To determine the orientation of the wafer at the first position, e.g. slot base #24, the button indicated at 1802 and labeled "Sample at Slot 24 Configuration" is clicked, which causes the outputs of the three laser sensors to be read. FIGS. 16A and 16B illustrate an example of a cassette as represented by the reference surface 520 which is oriented at an angle relative to a wafer 232 held by a robot blade at the slot base 24 position. The distance measurements of each laser sensor are indicated by the distances labeled as Left-Front__LASER$_{OFFSET}$ (24), Right-Front__LASER$_{OFFSET}$ (24), and Back__LASER$_{OFFSET}$ (24), for the left-front laser sensors 510b, 510y and 510r, respectively. The distance measurement output by each laser sensor corresponds to the offset distance labeled $D_{OFF}$ in FIG. 5 for each laser. As set forth above, this offset distance is the distance of the wafer from the reference surface 520.

If the cassette elevator mechanism has tilted the cassette in the left-right direction at the slot base 24 position, the degree of tilt and the direction (either left to right or right to left) will be indicated by the magnitude and sign of the difference between the distance measurements as Left-Front__LASER$_{OFFSET}$ (24) and Right-Front__LASER$_{OFFSET}$ (24) as measured by the two front laser sensors 510b and 510y, which are separated in the left-right direction as shown in FIGS. 6a and 16B. The measured difference at slot base 24 is indicated as Left-Right$_{OFFSET}$ (24) in FIG. 16B and is equal to Left-Front__LASER$_{OFFSET}$ (24) minus Right-Front__LASER$_{OFFSET}$ (24). If the blade and wafer are precisely parallel to the cassette reference surface 520 in the left-right direction, both of the Left-Front__LASER$_{OFFSET}$ (24) and Right-Front__LASER$_{OFFSET}$ (24 readings should be the same such that the difference measurement Left-Front__LASER$_{OFFSET}$ (24) will be zero (or within acceptable tolerance) at the slot base 24 position.

If the cassette elevator mechanism has tilted the cassette in the front-back direction at the slot base 24 position, the degree of tilt and the direction (either front to back or back to front) will be indicated by the magnitude and sign of the difference between the distance measurements Avg__Front__LASER$_{OFFSET}$ (24) and Back__LASER$_{OFFSET}$ (24). The reading Back__LASER$_{OFFSET}$ (24) is provided by the back laser sensor 510r and the value Avg__Front__LASER$_{OFFSET}$ (24) is an average of the distance measurements Left-Front__LASER$_{OFFSET}$ (24) and Right-Front__LASER$_{OFFSET}$ (24) as measured by the two front laser sensors 510b and 510y, at the slot base 24 position. This measured difference at slot base 24 is indicated as Front-Back$_{OFFSET}$ (24) in FIG. 16A and is equal to Avg__Front__LASER$_{OFFSET}$ (24) minus Back_LASER$_{OFFSET}$ (24). If the blade and wafer are precisely parallel to the cassette reference surface 520 in the front-back direction, both of the Avg_Front_LASER$_{OFFSET}$ (24) and Back_LASER$_{OFFSET}$ (24) readings should be the same such that the difference measurement as Front-Back$_{OFFSET}$ (24) will be zero (or within acceptable tolerance) at the slot base 24 position.

The wafer orientation measurements taken at a first elevator height, such as the slot base 24 position discussed above, may then be compared to wafer orientations measurements taken at a second elevator height. This comparison may be used to determine if the elevator tilts the cassette as the cassette is moved from the first elevator height to the second elevator height.

Figure 16C:
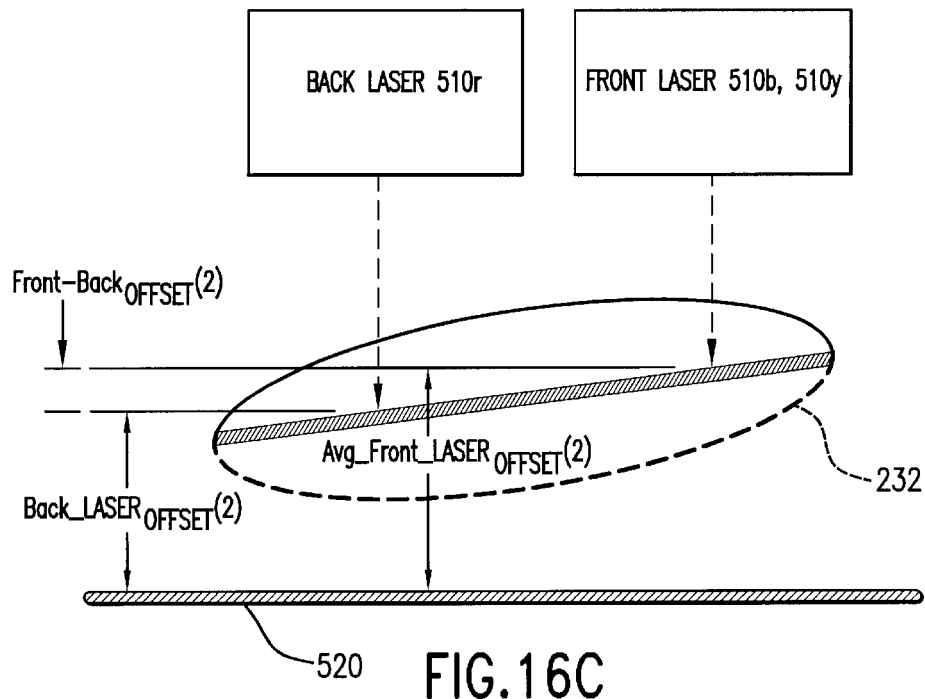
FIG. 16c is a schematic side view of a wafer orientation measurement procedure at a second elevator height.
Figure 16D:
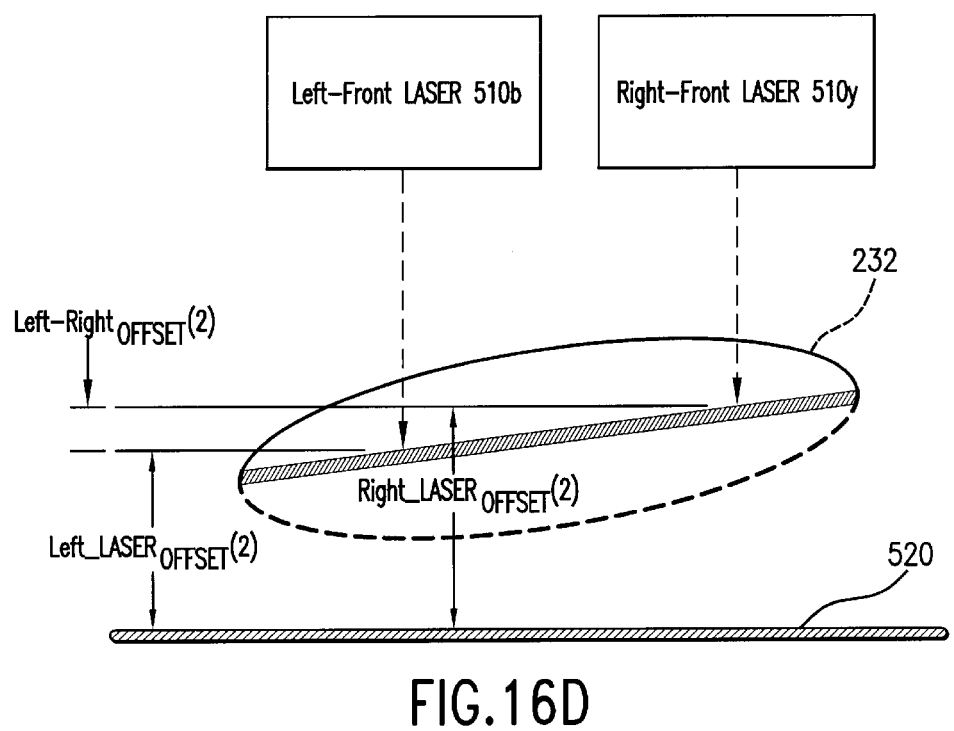
FIG. 16d is a schematic front view of a wafer orientation measurement procedure at the second elevator height.

In the illustrated embodiment, the metrology cassette may be inverted and replaced onto the cassette handler platform to facilitate wafer/cassette orientation measurements at the lower slot number positions. For example, FIG. 17 shows the metrology cassette 410 in the inverted position in which the precision internal reference surface 520 which provides a fixed reference point from which all measurements may be gauged, is fixed adjacent the support 200, to emulate the bottom of a cassette whereas the laser sensors are spaced from the support in a position at the top of a production cassette. In the illustrated embodiment, the plate 612 and the associated registration surfaces of the metrology cassette 410 are manufactured so that the reference surface 520 is relatively flat and parallel with respect to the base plane 220 of the platform 200 of the cassette handler to a relatively high degree of precision in the inverted position as well the noninverted position depicted in FIG. 5. Again, like the noninverted position, all subsequent distance measurements of the wafer can be made as offsets to this reference surface 520. Thus, the wafer position in a position such as the slot #2 base may be calculated as the difference or offset D$_{OFF}$ between the measured reference distance D$_{REF}$ and the measured wafer distance D$_{WAF}$ as shown in FIG. 17. Such inversion is useful to measure the slot base positions adjacent the support, in those applications in which the distance sensors such as the illustrated laser heads would otherwise interfere with insertion or retraction of the wafer blade. The robot blade may then be withdrawn from the metrology cassette and the metrology cassette is then inverted as shown in FIG. 17. After commanding the cassette handler to move the metrology cassette to slot base #2, the robot blade may then be extended back into the metrology cassette and the orientation of the wafer relative to the cassette reference surface 520 may be determined as depicted in FIGS. 16c and 16d at slot base #2 in the same manner as that done at slot base #24.

To determine the orientation of the wafer at the second position, e.g. slot base #2, the button indicated at 1804 (FIG. 18) and labeled "Sample at Slot 2 Configuration" is clicked, which causes the outputs of the three laser sensors to be read. FIGS. 16c and 16c illustrate an example of a cassette as represented by the reference surface 520 which is oriented at an angle relative to a wafer 232 held by a robot blade at the slot base 2 position. The angle at which the cassette is oriented at slot base #2 position may differ from the angle at which the cassette is held at slot base #24. The distance measurements of each laser sensor are indicated by the distances labeled as Left-Front_LASER$_{OFFSET}$ (2), Right-Front_LASER$_{OFFSET}$ (2), and Back_LASER$_{OFFSET}$ (2), for the left-front laser sensors 510b, 510y and 510r, respectively. The distance measurement output by each laser sensor corresponds to the offset distance labeled D$_{OFF}$ in FIG. 5 for each laser. As set forth above, this offset distance is the distance of the wafer from the reference surface 520.

If the cassette elevator mechanism has tilted the cassette in the left-right direction at the slot base 2 position, the degree of tilt and the direction (either left to right or right to left) will be indicated by the magnitude and sign of the difference between the distance measurements as Left-Front_LASER$_{OFFSET}$ (2) and Right-Front_LASER$_{OFFSET}$ (2) as measured by the two front laser sensors 510b and 510y, which are separated in the left-right direction as shown in FIGS. 6a and 16B. The measured difference at slot base 2 is indicated as Left-Front$_{OFFSET}$ (2) in FIG. 16B and is equal to Left-Front_LASER$_{OFFSET}$ (2) minus Right-Front_LASER$_{OFFSET}$ (2). If the blade and wafer are precisely parallel to the cassette reference surface 520 in the left-right direction, both of the Left-Front_LASER$_{OFFSET}$ (2) and Right-Front_LASER$_{OFFSET}$ (2 readings should be the same such that the difference measurement Left-Front_LASER$_{OFFSET}$ (2) will be zero (or within acceptable tolerance) at the slot base 2 position.

If the cassette elevator mechanism has tilted the cassette in the front-back direction at the slot base 2 position, the degree of tilt and the direction (either front to back or back to front) will be indicated by the magnitude and sign of the difference between the distance measurements Avg_Front_LASER$_{OFFSET}$ (2) and Back_LASER$_{OFFSET}$ (2). The reading Back_LASER$_{OFFSET}$ (2) is provided by the back laser sensor 510r and the value Avg_Front_LASER$_{OFFSET}$ (2) is an average of the distance measurements Left-Front_LASER$_{OFFSET}$ (2) and Right-Front_LASER$_{OFFSET}$ (2) as measured by the two front laser sensors 510b and 510y, at the slot base 2 position. This measured difference at slot base 2 is indicated as Front-Back$_{OFFSET}$ (2) in FIG. 16A and is equal to Avg_Front_LASER$_{OFFSET}$ (2) minus Back_LASER$_{OFFSET}$ (2). If the blade and wafer are precisely parallel to the cassette reference surface 520 in the front-back direction, both of the Avg_Front_LASER$_{OFFSET}$ (2) and Back_LASER$_{OFFSET}$ (2) readings should be the same such that the difference measurement as Front-Back$_{OFFSET}$ (2) will be zero (or within acceptable tolerance) at the slot base 2 position.

The orientation of the wafer held by the robot blade to the cassette reference surface at slot base #24 may be compared with the orientation of the wafer to the cassette reference surface 520 at slot base #2 to determine if the cassette orientation changes as the elevator mechanism elevates the cassette between the two positions. If so, the orientation of the cassette may be adjusted to compensate for the elevator tilt if the tilt is not too great. For example, the orientation of the wafer held by the robot blade to the cassette reference surface at slot base #24 may be averaged with the orientation of the wafer to the cassette reference surface 520 at slot base #2 in the following manner: Avg_Elev_Tilt_Front-Back$_{OFFSET}$=(Front-Back$_{OFFSET}$ (24)+Front-Back$_{OFFSET}$ (2))/2 and Avg_Elev_Tilt_Left-Right$_{OFFSET}$=(Left-Right$_{OFFSET}$ (24)+Left-Right$_{OFFSET}$ (2))/2. The values of the computed Avg_Elev_Tilt_Front-Back$_{OFFSET}$ and Avg_Elev_Tilt_Left-Right$_{OFFSET}$ may be displayed to the operator as the "Change in Front-Rear Level" and "Change in Side—Side Level" as indicated at 1810 in FIG. 18. The tilt angle of the metrology cassette 410 may then be adjusted in a manner similar to that described above in connection with the cassette wafer tilt angle adjustment, until the cassette is oriented at an angle that matches or otherwise compensates for the average (e.g. Avg_Elev_Tilt_Front-Back$_{OFFSET}$ and Avg_Elev_Tilt_Left-Right$_{OFFSET}$) of the measured elevator tilt angles at positions slot base 2 and 24. In this manner, the metrology cassette may be aligned relative to the robot blade such that when an actual cassette is installed in the cassette handler, the wafer held by the robot blade will be more parallel to the stack of wafers held within the cassette (or at another desired angle of orientation) as the elevator elevates the cassette between the various heights.

Such an elevator tilt angle adjustment may be combined with a desired wafer tilt angle adjustment as described above, to provide a final orientation of the cassette relative to the robot blade. Thus, for example, a Final_Front_Back$_{OFFSET}$ value may be calculated by summing the measured value Avg_Elev_Tilt_Front-Back$_{OFFSET}$ representing the average elevator tilt angle in the front-back direction, to the expected value Wafer_Tilt_Front-Back$_{OFFSET}$ representing the expected front to back differential offset distance value as a result of the wafer tilt angle of the population of cassettes being emulated. The front to back tilt angle of the cassette may then be adjusted until it matches the Final_Front-Back$_{OFFSET}$ value in a manner similar to that describe above. The adjustments to the cassette orientation as a result of both the elevator tilt angle and the wafer tilt angle, may be additive or negating, either in whole or in part, depending upon the respective directions of the measured tilt angle of the elevator and the wafer tilt angle of the cassette being emulated and the magnitudes of those angles.

It is appreciated that the wafer tilt angle may be measured various ways in addition to using distance sensors as described above. For example, a level sensor such as a gravity level sensor may be placed in a slot of a production cassette such as the cassette 190 when the cassette is disposed on the elevator platform 200. Alternatively, the level sensor may be placed on the metrology cassette 410, such as on reference surface 520 when the metrology cassette 410 is disposed on the elevator platform 200. A reading may then be taken from the level sensor at the first elevator position. This initial reading indicates the elevator tilt angle at that first height. The elevator may then be commanded to move to a different height and another reading may be taken from the level-sensing wafer at that height. If elevator tilt angle has changed, then it may be concluded that the elevator motion is inducing a tilt which may be compensated for as described above.

Although the elevator of the illustrated embodiment utilizes a leadscrew mechanism, it is appreciated that the elevator tilt angle and other characteristics of the elevator movement may be accurately determined for a variety of elevator mechanisms. In addition, utilizing level sensors or distance sensors having an appropriate range, localized abnormalities may be detected by taking multiple readings at spaced locations along the elevator travel path.

The cassette alignment tool system of the present invention may be used with a variety of workpiece handling systems. For example, in some wafer handling systems the combinations of leadscrews, motors and drive pulleys used are often the same.

Once the desired calibration and alignment procedures discussed above have been completed for a particular handling system and the associated robot blade and workpiece, the metrology cassette 410 may be removed from the handler and processing of workpieces may begin using a standard workpiece cassette which was emulated by the metrology cassette 410. However, it is preferred that all handlers of a particular processing system be properly aligned prior to initiating processing of production workpieces.

Metrology Cassette 410 Mechanical Construction and Features

The metrology cassette or fixture 410 of the illustrated embodiment is a precision frame assembly emulating the size and mounting interfaces of a wide range of plastic wafer cassettes. The variable attributes of individual cassettes such as slot positions and spacing can be defined in software instead of requiring physical changes to the metrology cassette 410.

As described above, the laser sensors housed within the metrology cassette 410 use the reference surface 520 of the cassette 410 as a "zero" point. In that the height of the reference surface 520 is known, the true height of the wafer may be easily calculated using the measured offset from the reference height. Since this height typically does not appreciably vary with time or temperature (normal extremes), the lasers can be "soft zeroed" using the offset measured from the reference surface 520.

The laser sensors of the illustrated embodiment have a linear measurement range of 3.149"±0.7874" (80.00 mm±20.00 mm). Because of the thickness of the base plate 630 (FIG. 5) and the height of the laser head mounting brackets 512 (FIGS. 5 and 6), the linear measurement range of the laser heads covers slots 1–4 and 22–25 for most styles of cassettes. On some systems, the robot blade wrist may interfere with the top and bottom plates, limiting the mechanically usable slot range to 2–4 and 22–24. These ranges as well as other sizes, characteristics and values are provided as examples and can vary, depending upon the type of distance sensor selected and the intended application.

The laser head supports on the mounting brackets 512 may be pin-located and color coded in their positions, and are preferably not mechanically interchangeable so as to prevent setup errors. The laser heads may be located in a variety of patterns including the illustrated triangular pattern (FIG. 6A) which facilitates height measurement operations or an in-line pattern (FIG. 6B) which facilitates blade characterization. The particular pattern selected may vary depending upon the application.

The mechanical framework of the metrology cassette 410 serves a number of functions in addition to enclosing and supporting the laser sensors. One such function of the fixture is the precise positioning of the reference surface 520 for the laser sensors. It is preferably flat, parallel to the base, and precisely at a defined reference height. In the illustrated embodiment, this reference height of the reference surface 520 is the height marked $D_{NOTINV}$ which is the height of the reference surface above the cassette handler platform base plane 220 when the metrology cassette is in the noninverted position as shown in FIGS. 5 and 9. It is preferred that this dimension be tightly controlled to increase the accuracy of the height measurements. The tolerance specifications for this surface in the illustrated embodiment are as follows:

Flatness: ±0.002" (±0.05 mm) overall

Parallelism: ±0.002" (±0.05 mm)

Height $D_{NOTINV}$ (referenced to base plane 220 of platform 200):

i. $D_{NOTINV}$±0.002" (181.04 mm±0.05 mm)

As set forth above, another preferred construction feature is the thickness of the upper reference plate 612 from its topmost surface in the noninverted orientation to the reference surface 520. This thickness defines another reference height of the reference surface 520. This second reference height is the height marked $D_{INV}$ which is the height of the reference surface 520 above the cassette handler platform base plane 220 when the metrology cassette is in the inverted position as shown in FIG. 16. Its specification in the illustrated embodiment is:

Thickness: $D_{INV}$±0.002" (±0.05 mm)

Adding the two reference heights to one another, the overall height of the metrology cassette 410 is:

Total Height: $D_{iNV} + D_{NOTINV} \pm 0.004"$ ($\pm 0.10$ mm)

Furthermore, the finish of the reference surface 420 is preferably compatible with the laser sensors. In the illustrated embodiment, the reference surface 520 is lapped, ground and "vapor honed" to a matte finish (0.000016" (0.00041 mm) RMS) to within $\pm 0.001"$ ($\pm 0.0255$ mm) flatness across its entire working surface. The reference surface is also hard anodized to deposit a layer which provides a surface which is similar to a white unglazed ceramic.

FIG. 12a shows a top view of the top plate 612 of the metrology cassette. The top plate 612 has base plane surfaces which engage the base plane 220 of the cassette handler platform 200. Those cassette base plane surfaces and other topmost surface features of the top plate are preferably themselves flat within 0.002" (0.05 mm) for the fixture 410 to fit into the system's cassette handler nest in the cassette noninverted position without rocking. These features also may have tight tolerances applied to them so that the assembly will not have excessive lateral movements during its use. The cassette base plane surfaces and other surface features of the bottom plate 630 may be similarly constructed to facilitate fitting into the system's cassette handler nest in the cassette noninverted position.

As best seen in FIGS. 5 and 6, the metrology cassette 410 has side rails 570 which support and locate the reference plate 612. In addition the side rails 570 maintain the "squareness" of the shape of the metrology cassette. A webbing 572 (FIG. 8) in the front (wafer entry side) of the fixture 410 is provided to increase its stability and strength. These pieces also serve as registration surfaces for systems such as the P5000 Ergonomic Cassette Handler (sold by Applied Materials, Inc.) that rely upon certain upper-portion features for location.

In the illustrated embodiment the components of the fixture 410 are preferably located and assembled with dowel pins 580 to ensure that the basic accuracy of the fixture is not compromised under normal operating conditions. The top surface of the plate 612 and the bottom surface of the plate 630 are both machined to imitate the bottom features of common wafer cassettes. Thus, the exterior of the metrology cassettes emulates the bottom surface features, wafer cassette vertical profile, sidebars, "H" bar, et cetera. This allows it to be inserted into most systems with the reference plate on top or bottom. This is very useful when characterizing leadscrews and determining slot spacing. In addition, this widens the applicability of the fixture because it allows upper and lower slot alignments to be performed. It also allows topside and bottom side rotations and extensions to be determined. These features include the H-bar 622 as shown in FIG. 12a. Variations and compromises from the features of individual cassettes can be made so as to accommodate the widest possible range of systems and cassettes. For example, by choosing the smallest size of the registration surfaces within the permitted range of tolerances of the cassettes to be emulated, the number of cassettes which can be emulated by a single tool 410 may be increased.

The metrology cassette 410 of the illustrated embodiment is lightweight, preferably approximating the mass of a production wafer cassette full of wafers. It should be noted that the precise location of the fixture in the horizontal plane (X-Y) is significant primarily in the extension/rotation alignment setups because the plate 612 contains the precision alignment hole 600 for extension and rotation determinations.

The dimensions, ranges, shapes, materials, sizes, characteristics, finishes, processes and values of the metrology cassette construction are provided as examples and can vary, depending upon the intended application.

Interface controller 412 Construction and Features

The interface controller 412 of the illustrated embodiment serves multiple functions in the cassette alignment tool system 400 set. Among other things, it acts as a power conditioning and distribution center, a signal conditioner and converter, display, communications driver, and operator interface. Thus, the computer generated graphical interface may be eliminated in some applications.

Figure 20:
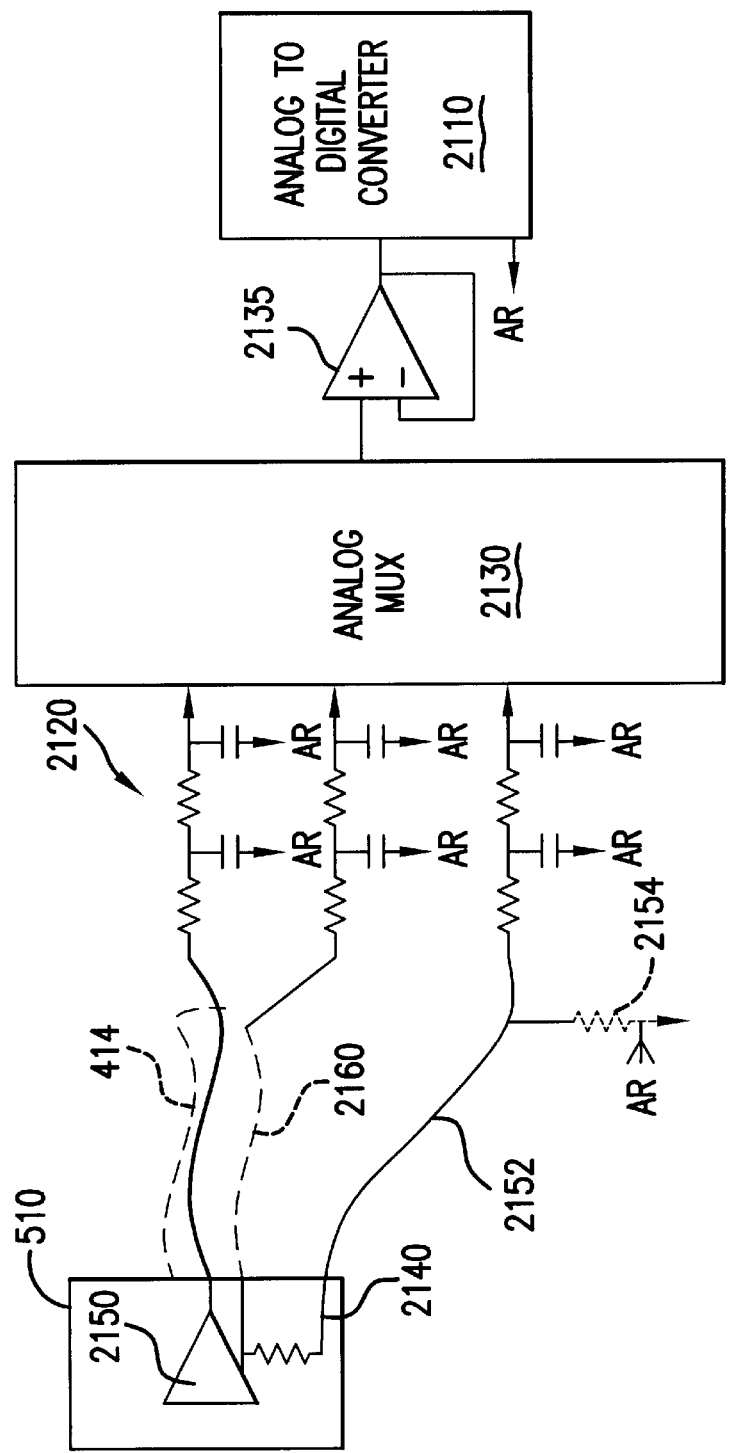
FIG. 20 is a schematic diagram of the interface controller signal processing circuit for sampling signals from the laser head sensors.

Outputs from the laser sensors range from −5.0000 to +5.0000 volts. This voltage range corresponds to the limits of the linear measurement range, as previously mentioned. An internal high-precision analog-to-digital converter 2110 (FIG. 20) is used to change the incoming voltage level into a signed binary number which is then converted to Inch or Metric readings for display or transmission. The display conversion range in the illustrated embodiment is −1.5745" (−40.00 mm) to +1.5745" (+40.00 mm), which represents an input voltage range of −10.0000 to +10.0000 volts. Because the sensors of the illustrated embodiment output half this voltage range, representing half this distance, the usable display range is −0.7875" (−20.00 mm) to +0.7875" (+20.00 mm).

Due to the highly sensitive nature of the sensors preferably used in this tool, their outputs can be relatively noisy, having electrical glitches and "shot" noise superimposed on their output signals. This is preferably carefully filtered out by a filter circuit 2120 which couples the signal line of the cable 414 from the laser sensors to an analog input multiplexer 2130. An isolation amplifier 2135 isolates the multiplexer output from the converter input. In addition, the outputs of the laser heads are referenced to an analog ground point AR which is coupled to ground point 2140 inside the sensors' amplifiers 2150 by a power return line 2152 which has an effective line wiring resistance as represented by resistance 2154. For this reason, the outputs also carry a common mode voltage offset voltage component in addition to everything else.

As shown in the filter circuit 2120, the cassette alignment tool system 400 interface controller 412 is specially designed to filter the incoming signals relative to their internal ground points including the cable shielding 2160, while also filtering the ground point voltages. These are sensed and digitized separately and compared to determine the true signal voltage outputs from the sensors.

Despite all the analog filtering, local environment RFI (radio frequency interference), low frequency AC fields, and magnetic fields can still affect readings. To reduce or eliminate the effects of these environmental factors, the sensors are preferably sampled many times and the results are averaged to obtain the readings that are finally displayed. An options switch on the bottom of the PC board in the interface controller 412 can control how many readings are averaged.

Once filtered, converted, sampled, averaged, the readings are displayed on the local LCD screen 530 and are also broadcast on the serial port to the computer 416.

Information transmitted on the serial port is updated once per second typically. In addition, the driver software for the serial port emits a synchronization signal and senses for a similar signal from a remote connection. The transmitted signal is used to indicate to the cassette alignment tool system 400 that an interface controller 412 is connected and active. When a similar signal is received from the cassette alignment tool system 400 (or other host), the interface controller 412 switches from local to remote mode. In this mode, the LCD display is not updated periodically. Instead, it serves as a data terminal display for the cassette alignment tool system 400, allowing messages to be sent and shown.

Other than during the warm-up period, the front panel buttons are preferably continuously scanned. Activation of any of these buttons causes a message to be sent over the serial port. The inch/metric switch condition is preferably not transmitted to the computer 416 of the cassette alignment tool system 400, as it contains its own option selector for this condition.

The interface controller 412 is a metal clamshell structure with the majority of the electronics attached to its front face cover. The laser sensor amplifiers are mounted to its base. Multicolor silk-screening and grouped connectors help to prevent connection errors. The extender cords for the laser measurement heads are also color-coded. The interface controller 412 accommodates five laser sensors, although three are shown installed in the illustrated embodiment. More or fewer sensors may be provided depending upon the applications. These sensors are color-coded and correspond directly to the red, blue and yellow color-coded laser sensor heads on the metrology cassette 410.

A 4 line by 40 character high contrast LCD display with back light is provided. Indicator LEDs for the slide switch-selectable English/Metric mode display and for prompting the operator during procedures are available on the front face. An RS-232 serial port enables connection and communication to the cassette alignment tool system computer 416. This connection provides ASCII (human readable) data in a 9600, N, 8,1 format. Connections to standard DB-9M PC COM ports (IBM-AT standard) are accomplished using a 9 wire male-female pass through cable. A null modem adapter or cable is preferably not to be used for normal connection to standard PC ports. Front panel pushbuttons include Zero, Back, Select, and Next functions. When communications are established with a host computer and the cassette alignment tool system 400, the functions of these buttons are echoed in the cassette alignment tool system 400. The corded "universal" switching power supply accepts 90–265 VAC inputs from 45–75 hertz. The power supply accepts world standard IEC320 style line cords which allow the operator to plug in whatever local style is appropriate. Alternatively the interface controller 412 will accept "clean" 24±4 VDC from any convenient source. The center pin of the rear-panel-mounted power jack is positive. The power input is reverse polarity protected and fused. The power to the laser heads is preferably not provided to all of the heads at one time at start up. Instead, it is preferred that the heads be switched on in sequence, one at a time to facilitate proper operation.

A single 16-bit analog-to-digital converter is utilized for conversions from the laser head outputs to numeric information. This promotes uniformity and stability. The laser head signal inputs are heavily electrically filtered to enhance rejection of electrical and RF noise, as well as to reduce the effects of "shot noise" in their signals. The analog multiplexing circuitry is buffered to minimize variations from channel-to-channel. Multiplexer-induced variations are typically less than 0.002% of the final readings, therefore they are negligible. Samples of the laser head outputs are taken 160 times per second, but 128 or 256 readings are averaged to obtain each update value. This provides improved immunity to false readings caused by AC line pickup and line noise. The signals are taken from the laser heads in "Kelvin" style. That is to say that the ground reference is taken from a separate connection that is referenced internally to the laser heads. The true signals are differential voltages from this reference point. This technique reduces or eliminates "ground loop" (common mode) voltage effects. The options switch on the printed circuit board allows the operator to select the displayed resolution for English (inch) measurements. If set to "off", inch measurements are shown on the box's display as four decimal place numbers. If "on" they are displayed as three decimal place numbers. The switch setting has no effect upon metric (mm) displays, but has one other effect. When "off", 256 measurement samples are averaged to obtain each display update. When "on", 128 measurement samples are averaged. This affects the display update and reporting speed, but provides significantly greater stability for four decimal place displays.

The dimensions, ranges, shapes, materials, sizes, characteristics, finishes, processes and values of the interface controller construction and circuitry are provided as examples and can vary, depending upon the intended application.

It will, of course, be understood that modifications of the illustrated embodiments, in its various aspects, will be apparent to those skilled in the art, some being apparent only after study others being matters of routine mechanical and electronic design. Other embodiments are also possible, their specific designs depending upon the particular application. For example, a variety of methods and devices for physical measurements may be utilized in addition to those described above. Such methods and devices may include, for example, inductive and capacitive proximity sensors, non-laser optical sensors, sonic distance sensors and others. A variety of workpiece cassette shapes and sizes may also be utilized. Furthermore, a variety of graphical displays visually depicting alignments and misalignments and the degrees of such may be used in addition to or instead of numerical displays. As such, the scope of the invention should not be limited by the particular embodiments described herein but should be defined by the appended claims and equivalents thereof.

What is claimed is:

1. A method of aligning a cassette handler to a robot blade in a workpiece handling system wherein said cassette handler has a support surface for supporting a workpiece cassette having a plurality of slots for carrying workpieces, and wherein said handler has an elevator for elevating said support surface, comprising:

taking a first measurement of the tilt orientation of said support surface at a first height of said elevator; taking a second measurement of the tilt orientation of said support surface at a second height of said elevator; and adjusting the tilt orientation of said support surface as a function of said first and second measurements of the tilt orientation of said support surface.

2. The method of claim 1 wherein said function is a function of the average of said first and second measurements.

3. The method of claim 1 further comprising taking a third measurement of the tilt orientation of said support surface at a third height of said elevator wherein said function is a function of said first, second and third measurements.

4. The method of claim 1 wherein said measurement takings of the tilt orientations of said support surface are measured relative to the orientation of a workpiece carried by a robot blade.

5. The method of claim 4 wherein each of said measurement taking includes measuring the distances between a reference plane and at least three points on said workpiece using at least one optical distance sensor.

6. The method of claim 5 wherein said optical sensor is carried by a frame which also defines said reference plane.

7. The method of claim 4 wherein each of said measurement takings includes measuring the respective distances between three points on said workpiece and three optical distance sensors.

8. The method of claim 1 wherein said first measurement taking at said first height includes placing a frame on said cassette handler support surface in a first orientation of said frame relative to said handler support surface; and determining the respective distances of at least three points on said workpiece carried by said robot blade relative to said frame.

9. The method of claim 8 wherein said second measurement taking at said second height includes placing said frame on said cassette handler support surface in a, second, inverted orientation of said frame relative to said first frame orientation; and determining the respective distances of said workpiece carried by said robot blade relative to said frame in said second orientation.

10. The method of claim 1 wherein each said measurement taking comprises measuring the distances of a plurality of locations on a workpiece carried by said robot blade relative to a frame supported by said support surface.

11. The method of claim 10 wherein each said orientation measurement taking comprises using laser distance sensors carried by said frame and positioned to measure the orientation of said workpiece carried by said robot blade relative to said frame.

12. The method of claim 1 wherein said adjusting includes displaying a representation of adjustments to be made to the tilt orientation of said support surface as a function of said first and second measurements of the tilt orientation of said support surface.

13. The method of claim 10 further comprising displaying numerical representations of said measured orientation of said frame relative to said workpiece carried by said robot blade.

14. The method of claim 10 further comprising displaying at least one of a numerical representation and a graphical representation of said measured orientation of said frame relative to said workpiece carried by said robot blade.

15. The method of claim 14 wherein said adjusting comprises adjusting the orientation of said cassette handler surface until said displayed representation of said measured orientation corresponds to a desired orientation of said frame relative to said workpiece carried by said robot blade.

16. A method of aligning a cassette handler to a robot blade in a workpiece handling system wherein said cassette handler has a support surface for supporting a workpiece cassette having a plurality of slots for carrying workpieces, and wherein said handler has an elevator for elevating said support surface, comprising:

placing a frame on said cassette handler support surface wherein said frame has at least three optical distance sensors;

positioning a wafer carried by a robot blade in said frame opposite said three sensors;

taking a first measurement of the tilt orientation of said frame on said support surface relative to said wafer at a first height of said support surface;

elevating said support surface to a second height using said elevator;

taking a second measurement of the tilt orientation of said frame on said support surface relative to said wafer on said robot blade at said second height;

determining a desired tilt orientation as a function of the average of said first and second measurements of the tilt orientation of said frame on said support surface; and adjusting the tilt orientation of said frame on said support surface to match said desired tilt orientation.

17. The method of claim 16 further comprising taking additional measurements of the tilt orientation of said frame on said support surface and continuing said adjusting until the measured tilt orientation of said frame on said support surface matches said desired tilt orientation.

18. A metrology system for aligning a cassette handler to a robot blade in a workpiece handling system wherein said cassette handler has a support surface for supporting a workpiece cassette having a plurality of slots for carrying workpieces, and wherein said handler has an elevator for elevating said support surface, comprising:

a frame adapted to be supported by said cassette handler support surface, said frame having a plurality of sensors positioned to measure the tilt orientation of said frame when supported by said support surface;

a display; and a programmed processor coupled to said sensors and display and adapted to:
a) control said sensors to take a first measurement of the tilt orientation of said frame on said support surface at a first height of said support surface; b) control said sensors to take a second measurement of the tilt orientation of said frame on said support surface at a second height of said support surface; and c) display on said display a representation of adjustments to be made to the tilt orientation of said support surface as a function of said first and second measurements of the tilt orientation of said support surface.

19. A metrology system for aligning a cassette handler to a robot blade in a workpiece handling system wherein said cassette handler has a support surface for supporting a workpiece cassette having a plurality of slots for carrying workpieces, and wherein said handler has an elevator for elevating said support surface, comprising:

frame means adapted to be supported by said support surface, for emulating a cassette;

sensor means carried by said frame means, for sensing the tilt orientation of said frame means when supported by said support surface;

display means for displaying indicia; and a programmed processor coupled to said sensor means and said display means for controlling said sensor means to take a first measurement of the tilt orientation of said frame means on said support surface at a first height of said support surface; for controlling said sensor means to take a second measurement of the tilt orientation of said frame means on said support surface at a second height of said support surface; and for causing said display means to display on said display means indicia representing adjustments to be made to the tilt orientation of said support surface as a function of said first and second measurements of the tilt orientation of said support surface.

* * * * *